US010269817B2

(12) United States Patent
Ogawa et al.

(10) Patent No.: US 10,269,817 B2
(45) Date of Patent: Apr. 23, 2019

(54) MID-PLANE WORD LINE SWITCH CONNECTION FOR CMOS UNDER THREE-DIMENSIONAL MEMORY DEVICE AND METHOD OF MAKING THEREOF

(71) Applicant: SANDISK TECHNOLOGIES LLC, Plano, TX (US)

(72) Inventors: Hiroyuki Ogawa, Nagoya (JP); James Kai, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/882,521

(22) Filed: Jan. 29, 2018

(65) Prior Publication Data

US 2018/0350825 A1 Dec. 6, 2018

Related U.S. Application Data

(62) Division of application No. 15/611,220, filed on Jun. 1, 2017, now Pat. No. 9,953,992.

(51) Int. Cl.
*H01L 27/1157* (2017.01)
*H01L 27/11524* (2017.01)
(Continued)

(52) U.S. Cl.
CPC .... *H01L 27/11524* (2013.01); *H01L 27/1157* (2013.01); *H01L 27/11529* (2013.01); *H01L 27/11556* (2013.01); *H01L 27/11573* (2013.01); *H01L 27/11575* (2013.01); *H01L 27/11582* (2013.01); *H01L 27/11548* (2013.01)

(58) Field of Classification Search
None
See application file for complete search history.

(56) References Cited

U.S. PATENT DOCUMENTS

| 5,915,167 A | 6/1999 | Leedy |
| 9,224,747 B2 | 12/2015 | Mizutani et al. |

(Continued)

OTHER PUBLICATIONS

Tanaka et al., "A 768Gb 3b/cell 3D-Floating Gate NAND Flash Memory," Solid-State Circuits Conference (ISSCC) Proceedings, Section 7.7 2016 IEEE International, Jan. 31-Feb. 4, 2016, 3pgs.

(Continued)

*Primary Examiner* — Thien F Tran
(74) *Attorney, Agent, or Firm* — The Marbury Law Group PLLC

(57) ABSTRACT

A three-dimensional memory array device can include mid-plane terrace regions between a pair of memory array regions. The electrically conductive layers of the three-dimensional memory array device continuously extend between the pair of memory array regions through a connection region, which is provided adjacent to the mid-plane terrace regions. Contact via structures contacting the electrically conductive layers can be provided in the mid-plane terrace regions, and through-memory-level via structures that extend through the alternating stack and connected to underlying lower metal interconnect structures and semiconductor devices can be provided through the mid-plane terrace region and/or through the connection region. Upper metal interconnect structures can connect the contact via structures and the through-memory-level via structures.

11 Claims, 43 Drawing Sheets

(51) Int. Cl.
  *H01L 27/11529* (2017.01)
  *H01L 27/11548* (2017.01)
  *H01L 27/11556* (2017.01)
  *H01L 27/11573* (2017.01)
  *H01L 27/11575* (2017.01)
  *H01L 27/11582* (2017.01)

(56) References Cited

U.S. PATENT DOCUMENTS

| | | | |
|---|---|---|---|
| 9,425,209 B1* | 8/2016 | Yang | H01L 27/11582 |
| 9,589,981 B2 | 3/2017 | Nishikawa et al. | |
| 9,646,981 B2 | 5/2017 | Nishikawa et al. | |
| 9,673,213 B1 | 6/2017 | Yu et al. | |
| 9,806,093 B2 | 10/2017 | Toyama et al. | |
| 9,818,693 B2 | 11/2017 | Toyama et al. | |
| 9,818,759 B2 | 11/2017 | Kai et al. | |
| 9,876,031 B1 | 1/2018 | Shimizu et al. | |
| 2011/0115010 A1 | 5/2011 | Shim et al. | |
| 2015/0001613 A1 | 1/2015 | Yip et al. | |
| 2016/0148835 A1* | 5/2016 | Shimabukuro | H01L 27/11556 257/314 |
| 2016/0148946 A1* | 5/2016 | Hironaga | H01L 27/11556 257/324 |
| 2016/0233229 A1 | 8/2016 | Oh et al. | |
| 2017/0148809 A1 | 5/2017 | Nishikawa et al. | |
| 2017/0179153 A1 | 6/2017 | Ogawa et al. | |
| 2017/0179154 A1 | 6/2017 | Furihata et al. | |
| 2017/0236746 A1 | 8/2017 | Yu et al. | |
| 2017/0294383 A1 | 10/2017 | Tanzawa | |
| 2017/0352678 A1 | 12/2017 | Lu et al. | |
| 2017/0358593 A1 | 12/2017 | Yu et al. | |

OTHER PUBLICATIONS

U.S. Appl. No. 15/489,050, filed Apr. 17, 2017, Sandisk Technologies LLC.
U.S. Appl. No. 15/581,575, filed Apr. 28, 2017, Sandisk Technologies LLC.
International Search Report and Written Opinion of the International Searching Authority for International Patent Application No. PCT/US2018/019466, dated May 28, 2018, 15 pages.

* cited by examiner

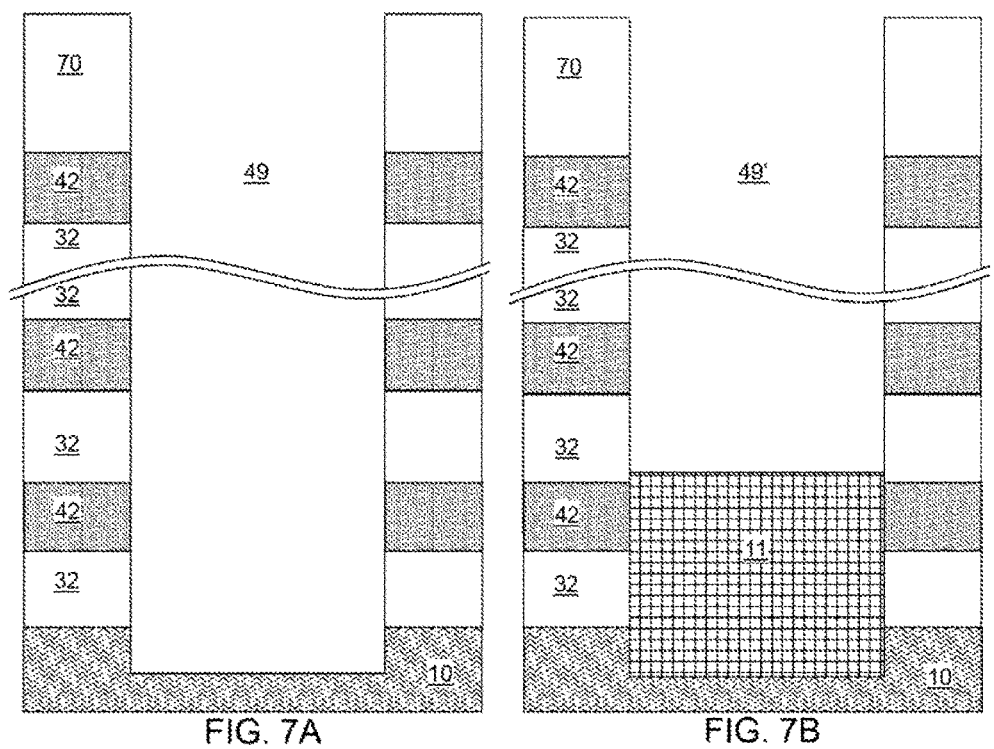

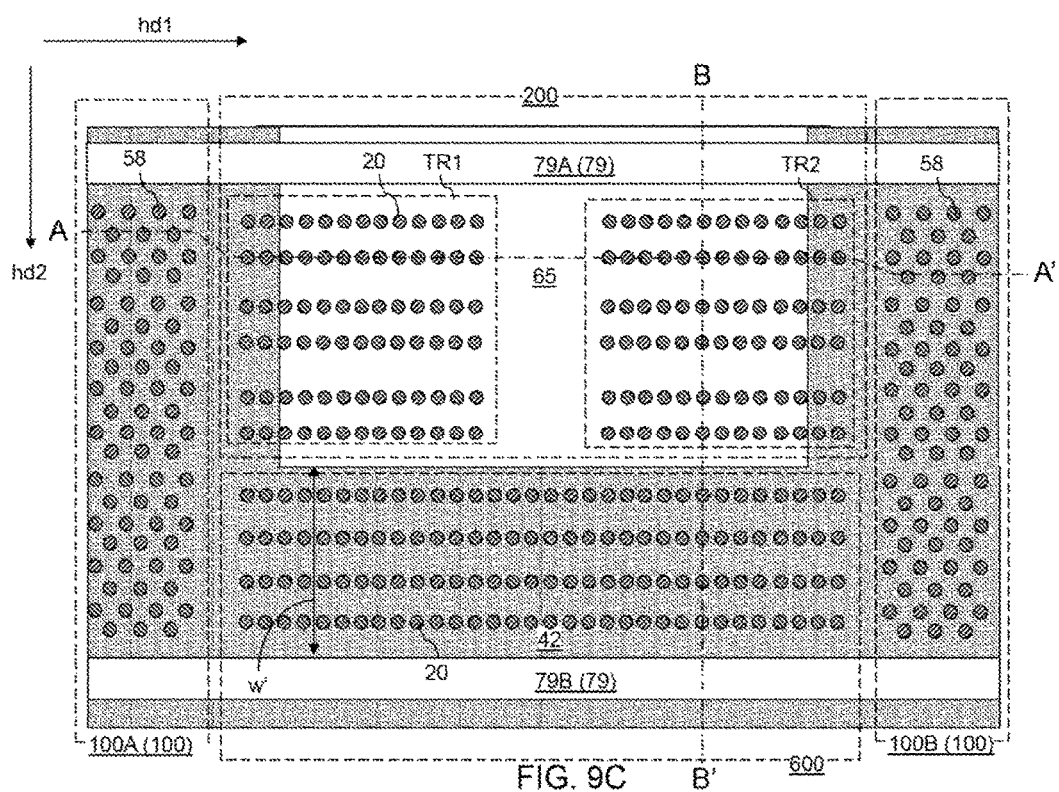

MID-PLANE WORD LINE SWITCH CONNECTION FOR CMOS UNDER THREE-DIMENSIONAL MEMORY DEVICE AND METHOD OF MAKING THEREOF

FIELD

The present disclosure relates generally to the field of semiconductor devices and specifically to three-dimensional memory devices employing mid-plane word line switch connections and methods of making the same.

BACKGROUND

Recently, ultra high density storage devices have been proposed using a three-dimensional (3D) stacked memory stack structure sometimes referred to as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

As three-dimensional memory devices scale to smaller device dimensions, RC delays in the word lines can cause significant signal delays and consequent performance degradations. Thus, a method of minimizing RC delays in three-dimensional memory devices is desired.

SUMMARY

According to an aspect of the present disclosure, a semiconductor structure is provided, which comprises an alternating stack of insulating layers and electrically conductive layers located over a substrate. The insulating layers and the electrically conductive layers within the alternating stack continuously extend into each of: a first memory array region including first memory stack structures that extend through the alternating stack; a second memory array region including second memory stack structures that extend through the alternating stack, wherein the second memory array region is laterally spaced from the first memory array region along a first horizontal direction; a first terrace region adjoined to the first memory array region and including first stepped surfaces of the alternating stack; a second terrace region adjoined to the second memory array region and including second stepped surfaces of the alternating stack and spaced from the first terrace region along the first horizontal direction, wherein the first terrace region and the second terrace region are located between the first memory array region and the second array region; and a connection region within which each of the insulating layers and the electrically conductive layers within the alternating stack continuously extends between the first and second memory array regions.

According to another aspect of the present disclosure, a method of forming a semiconductor structure is provided. An alternating stack of insulating layers and spacer material layers is formed over a substrate, wherein the spacer material layers are formed as, or are subsequently replaced with, electrically conductive layers. A connection region is covered with a patterned hard mask layer. A trimmable material layer is applied and patterned over the alternating stack, wherein the patterned trimmable material layer covers a first memory array region located on one side of the connection region and a second memory array region located on another side of the connection region, and does not cover a center portion of an intermediate region between the first memory array region and the second memory array region, the intermediate region being adjacent to the connection region. A first terrace region adjoined to the first memory array region is formed at one side of the intermediate region, and a second terrace region adjoined to the second memory array region is formed at another side of the intermediate region. The trimmable material layer and the patterned hard mask layer are removed, wherein each of the insulating layers and the spacer material layers within the alternating stack continuously extends between the first and second memory array regions through the connection region. First memory stack structures are formed in the first memory array region and second memory stack structures in the second memory array region.

According to another aspect of the present disclosure, a monolithic three-dimensional NAND memory device, comprises a memory plane comprising a first memory array region containing a first plurality of vertical NAND strings, a second memory array region containing a second plurality of vertical NAND strings, and a connection region connecting the first and the second memory array regions. A plurality of word lines continuously extend in a word line direction between the first and the second memory array regions through the connection region and a plurality of bit lines are located over the first and the second plurality of vertical NAND strings and extend in a bit line direction which is different from the word line direction. A first terrace region is located in the memory plane adjacent to the first memory array region, contains exposed portions of the word lines and faces the second memory array region, and a second terrace region is located in the memory plane adjacent to the second memory array region, contains exposed portions of the word lines and faces the first memory array region and the first terrace region. Word line contact via structures contact the respective word lines in the first and the second terrace regions. Through-memory-level via structures are located in the memory plane between the first and the second memory array regions, and electrically connect the word line contact via structures to word line switching transistors.

BRIEF DESCRIPTION OF THE DRAWINGS

FIGS. 7A-7H are sequential vertical cross-sectional views of a region around a memory opening during formation of a memory stack structure, a dielectric core, and a drain region therein according to an embodiment of the present disclosure.

FIG. 9C is a plan view of the exemplary structure of FIGS. 9A and 9B. The vertical plane A-A' corresponds to the plane of the vertical cross-sectional view of FIG. 9A. The vertical plane B-B' corresponds to the plane of the vertical cross-sectional view of FIG. 9B.

Figure 13A:
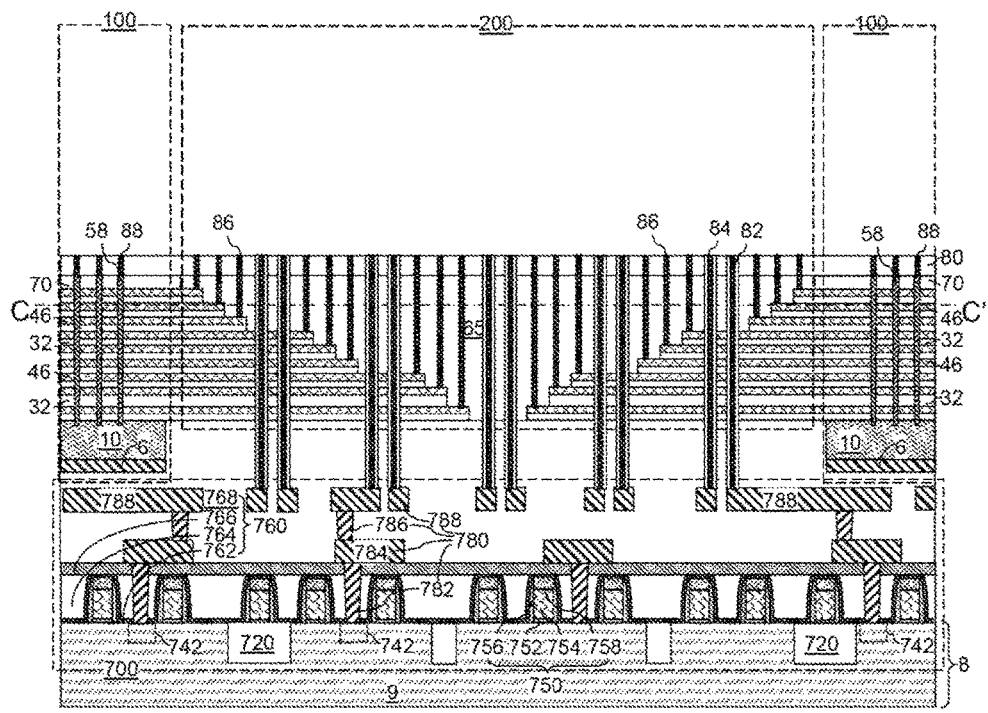
FIG. 13A is a first vertical cross-sectional view of the exemplary structure after formation of through-memory-level via structures according to an embodiment of the present disclosure.
Figure 13B:
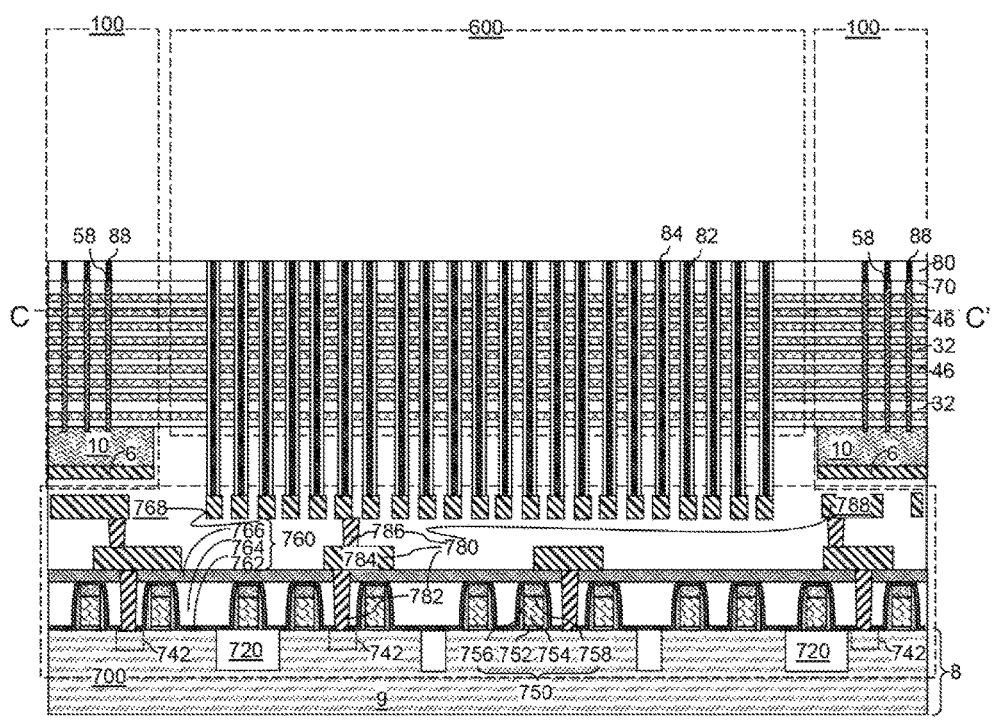
FIG. 13B is a second vertical cross-sectional view of the exemplary structure of FIG. 13A.

The vertical plane B-B' corresponds to the plane of the vertical cross-sectional view of FIG. 13B.

Figure 14:
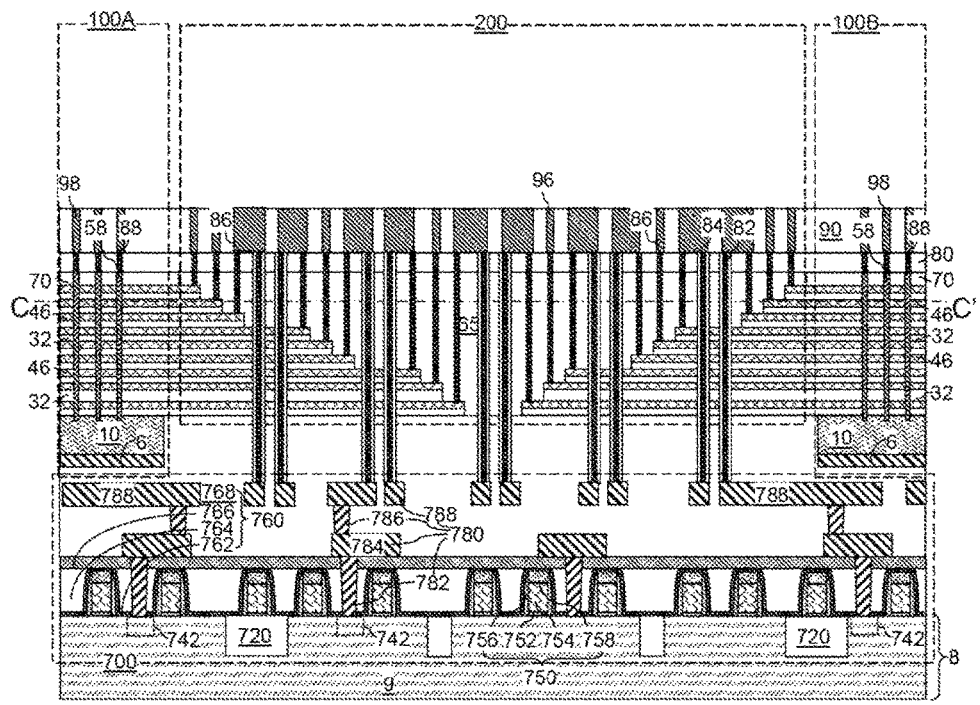

FIG. 14 is a vertical cross-sectional view of the exemplary structure after formation of upper level line structures according to an embodiment of the present disclosure.

DETAILED DESCRIPTION

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-memory-level" element refers to an element that vertically extends through a memory level.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. All measurements for electrical conductivities are made at the standard condition.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Figure 1A:
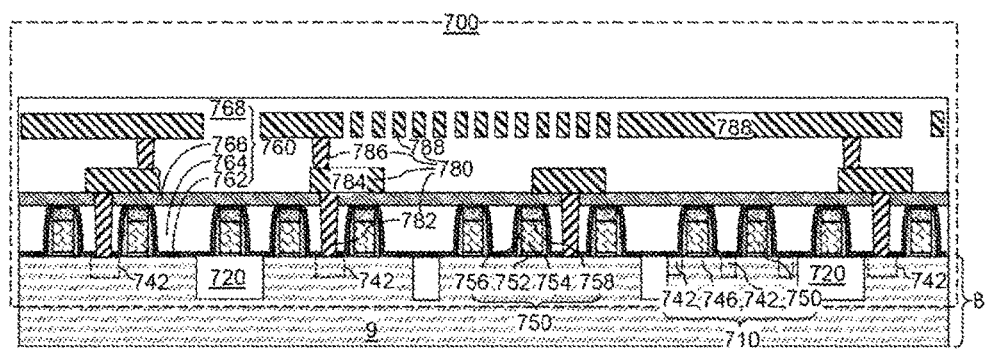
FIG. 1A is a vertical cross-sectional view of an exemplary structure after formation of semiconductor devices, at least one lower level dielectric layer, and lower level metal interconnect structures on a semiconductor substrate according to an embodiment of the present disclosure.
Figure 1B:
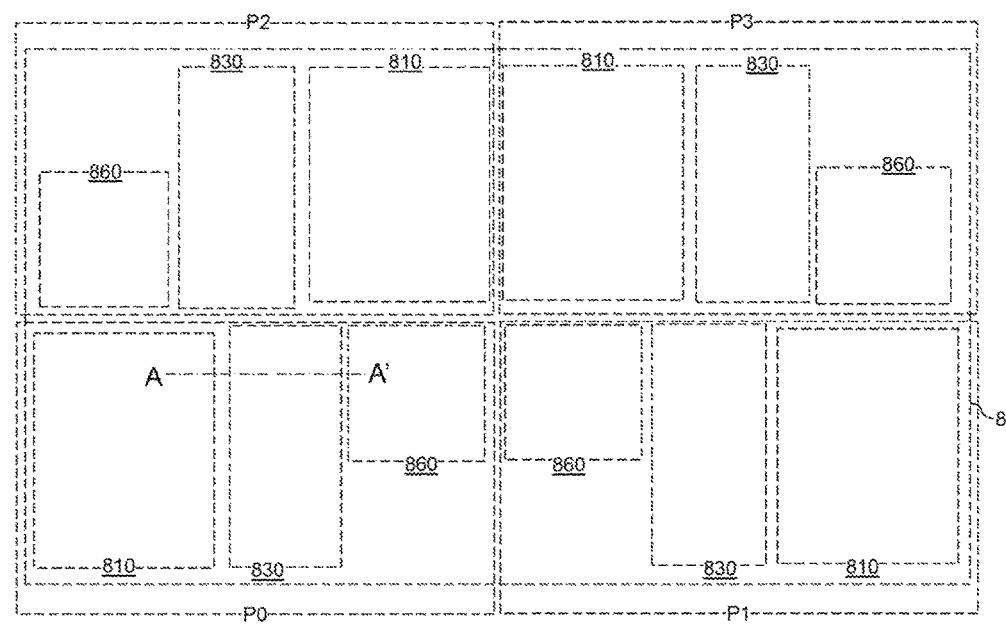
FIG. 1B is a plan view of the exemplary structure of FIG. 1A. The vertical plane A-A' corresponds to the plane of the vertical cross-sectional view of FIG. 1A.

Referring to FIGS. 1A and 1B, an exemplary structure according to an embodiment of the present disclosure is illustrated. The exemplary structure includes a semiconductor substrate 8, and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

At least one dielectric layer is formed over the semiconductor devices, which is herein referred to as at least one lower level dielectric layer 760. The at least one lower level dielectric layer 760 can include, for example, a dielectric liner 762 such as a silicon nitride liner that blocks diffusion of mobile ions and/or apply appropriate stress to underlying structures, a planarization dielectric layer 764 that is employed to provide a planar surface that is coplanar with the topmost surface of the dielectric liner 762 or the topmost surfaces of the gate structures 750, an optional planar liner 766, and at least one lower level interconnect dielectric layer 768 that collectively functions as a matrix for lower level metal interconnect structures 780 that provide electrical wiring among the various nodes of the semiconductor devices and landing pads for through-memory-level via structures to be subsequently formed. The lower level metal interconnect structures 780 can include various device contact via structures 782 (e.g., source and drain electrodes which contact the respective source and drain nodes of the device or gate electrode contacts), lower level metal lines 784, lower level via structures 786, and lower level topmost metal structures 788 that are configured to function as landing pads for through-memory-level via structures to be subsequently formed. The region of the semiconductor devices and the combination of the at least one lower level dielectric layer 760 and the lower level metal interconnect structures 780 is herein referred to an underlying peripheral device region 700, which is located underneath a memory-level assembly to be subsequently formed and includes peripheral devices for the memory-level assembly. The lower level metal interconnect structures 780 are embedded in the at least one lower level dielectric layer 760. In one embodiment, the topmost surfaces of the lower level topmost metal structures 788 may be located at or below a horizontal plane including the topmost surface of the at least one lower level dielectric layer 760. The combination of the lower metal interconnect structures 780 and the at least one lower level dielectric layer 760 (which may include multiple lower dielectric layers) that embeds the metal interconnect structures 780 are formed over the semiconductor devices 710. The lower metal interconnect structures 780 are electrically connected to the semiconductor devices 710.

The lower level metal interconnect structures 780 can be electrically shorted to active nodes (e.g., transistor active regions 742 or gate electrodes 750) of the semiconductor devices 710 (e.g., CMOS devices), and are located at the level of the at least one lower level dielectric layer 760. Only a subset of the active nodes is illustrated in FIG. 1 for clarity. Through-memory-level via structures (not shown in FIG. 1) can be subsequently formed directly on the lower level metal interconnect structures 780 to provide electrical connection to memory devices to be subsequently formed. In one embodiment, the pattern of the lower level metal interconnect structures 780 can be selected such that the lower level topmost metal structures 788 (which are a subset of the lower level metal interconnect structures 780 located at the topmost portion of the lower level metal interconnect structures 780) can provide landing pad structures for the through-memory-level via structures to be subsequently formed.

The semiconductor devices 710 can be arranged to provide various driver circuitries needed for operation of a three-dimensional memory array to be subsequently formed. For example, the semiconductor devices 710 can be arranged to provide sensor array regions 810 that include bit line sensors (e.g., sense amplifiers ("sense amps"), data latches, etc., which are subsequently connected to bit lines of the three-dimensional memory array), row decoder regions 830 that include word line switch devices, and sensor array driver regions 860 that include peripheral devices for the bit line sensors. Each bit line sensor can be configured to detect the level of current that flows through a respective bit line. The bit lines are formed over the three-dimensional memory array, and are connected to a respective column of drain regions. The word line switch devices are subsequently connected to a respective one of the word lines, which are the electrically conductive layers within an alternating stack of insulating layers and the electrically conductive layers to be subsequently formed. The word line switch devices provide electrical bias to the word lines during operation of the three-dimensional memory array.

Generally, a semiconductor die or a semiconductor package can be a single memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed and/or a smallest unit on which a read operation can be performed.

FIG. 1B illustrates a first plane P0, a second plane P1, a third plane P2, and a fourth plane P3 within a single die, which may, or may not, include additional planes. According to an aspect of the present disclosure, each plane (P0, P1, P2, P3) includes a plurality of sensor array regions 810, a plurality of row decoder regions 830, and a plurality of sensor array driver regions 860. In one embodiment, the plurality of row decoder regions 830 within each plane (P0, P1, P2, P3) can be arranged along a direction that passes through a geometrical center of the plane (P0, P1, P2, P3). The plurality of sensor array regions 810 and the plurality of sensor array driver regions 860 within each plane (P0, P1, P2, P3) can be arranged around the plurality of row decoder regions 830. In one embodiment, the arrangement of the plurality of sensor array regions 810 and the plurality of sensor array driver regions 860 may have a 180 degree rotational symmetry around the geometrical center of the plane (P0, P1, P2, P3), or a mirror symmetry around the axis passing through the geometrical center of the plane (P0, P1, P2, P3) and extending along the plurality of row decoder regions 830.

Figure 2A:
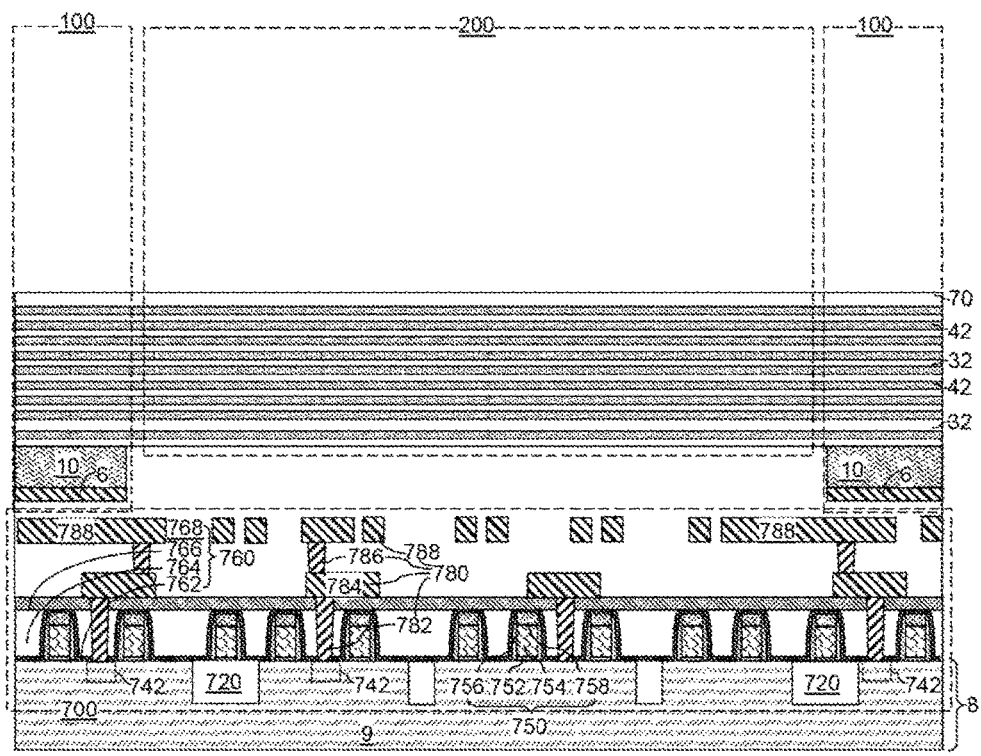
FIG. 2A is a vertical cross-sectional view of the exemplary structure after formation of a planar semiconductor material layer and an alternating stack of insulating layers and spacer material layers according to an embodiment of the present disclosure.
Figure 2B:
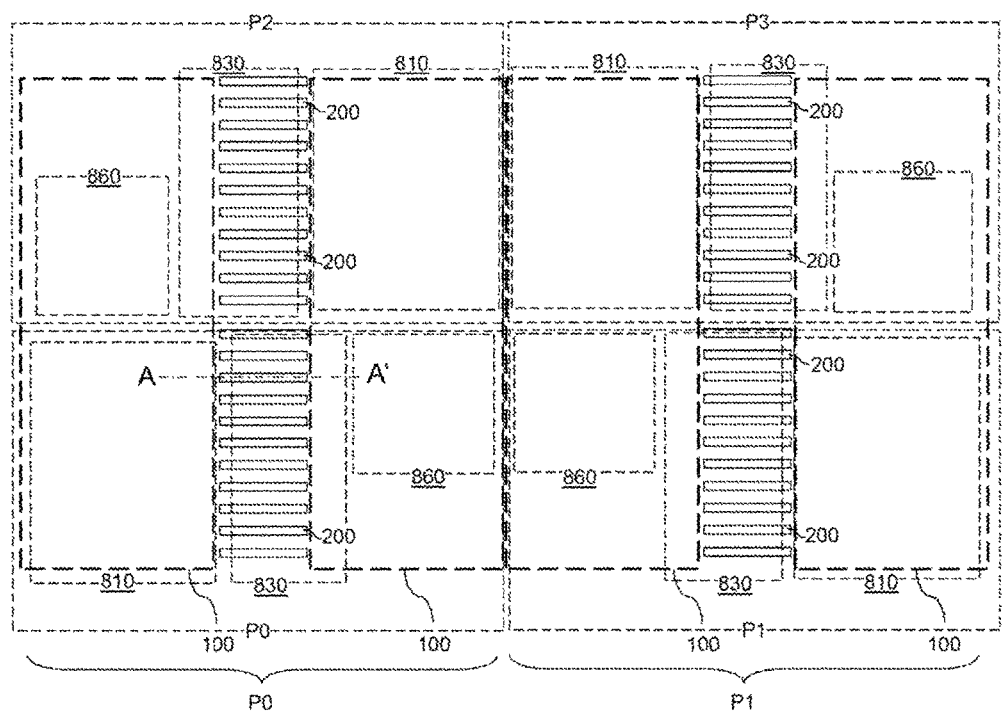
FIG. 2B is plan view of the exemplary structure of FIG. 2A. The vertical plane A-A' corresponds to the plane of the vertical cross-sectional view of FIG. 2A.

Referring to FIGS. 2A and 2B, an optional planar conductive material layer 6 and a planar semiconductor material layer 10 can be formed over the underlying peripheral device region 700. The optional planar conductive material layer 6 includes a conductive material such as a metal, metal silicide, metal nitride or a heavily doped semiconductor material. The optional planar conductive material layer 6, for example, may include a tungsten or tungsten silicide layer having a thickness in a range from 3 nm to 100 nm, although lesser and greater thicknesses can also be employed. A metal nitride layer (not shown) may be provided as a diffusion barrier layer on top of the planar conductive material layer 6. The planar conductive material layer 6 may function as a special source line in the completed device. Alternatively, layer 6 may comprise an etch stop layer and may comprise any suitable conductive, semiconductor or insulating layer.

The planar semiconductor material layer 10 can be formed over the at least one lower level dielectric layer 760. The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type.

An alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as an alternating stack.

The alternating stack can include insulating layers 32 as the first material layers, and spacer material layers as the second material layers. In one embodiment, the spacer material layers can be sacrificial material layers that are subsequently replaced with electrically conductive layers. In another embodiment, the spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be insulating layers 32 and sacrificial material layers 42, respectively. In one embodiment, each insulating layer 32 can include an insulating material, and each sacrificial material layer 42 can include a sacrificial material. An alternating plurality of insulating layers 32 and sacrificial material layers 42 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The alternating stack (32, 42) can include insulating layers 32 composed of the first material, and sacrificial material layers 42 composed of the second material, which is different from the first material. The first material of the insulating layers 32 can be at least one insulating material. Insulating materials that can be employed for the insulating layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. In one embodiment, the sacrificial material layers 42 can be material layers that comprise silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethylorthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

An insulating cap layer 70 is subsequently formed over the stack (32, 42). The insulating cap layer 70 includes a dielectric material, which can be any dielectric material that can be employed for the insulating layers 32. In one embodiment, the insulating cap layer 70 includes the same dielectric material as the insulating layers 32. The thickness of the insulating cap layer 70 can be in a range from 20 nm to 300 nm, although lesser and greater thicknesses can also be employed.

According to an aspect of the present disclosure, each plane (P0, P1, P2, P3) can include two memory array regions 100 that are laterally spaced apart in the word line direction by a plurality of word line contact via regions 200, as shown in FIG. 2B. Each word line contact via region 200 overlies at least a portion of one of the row decoder regions 830, and is adjoined to an edge of each of the two memory array regions 100. As used herein, a first element that adjoins a second element if the first element and the second element shares a common edge. The word line contact via regions 200 can be laterally spaced apart along the horizontal direction along which the row decoder regions 830 extend. Each memory array region 100 is a region in which a three-dimensional memory array is subsequently formed. Each word line contact via region 200 is a region in which word line contact via structures are subsequently formed, which contact word lines of the three-dimensional memory arrays. For example, each plane (P0, P1, P2, or P3) can include a total of N word line contact via regions 200 in which N is in a range from 8 to 1,024, although lesser and greater numbers can also be employed for N. The sensor array regions 810, the sensor array driver regions 860 and optionally portions of the row decoder regions 830 can underlie the memory array regions 100.

Figure 3A:
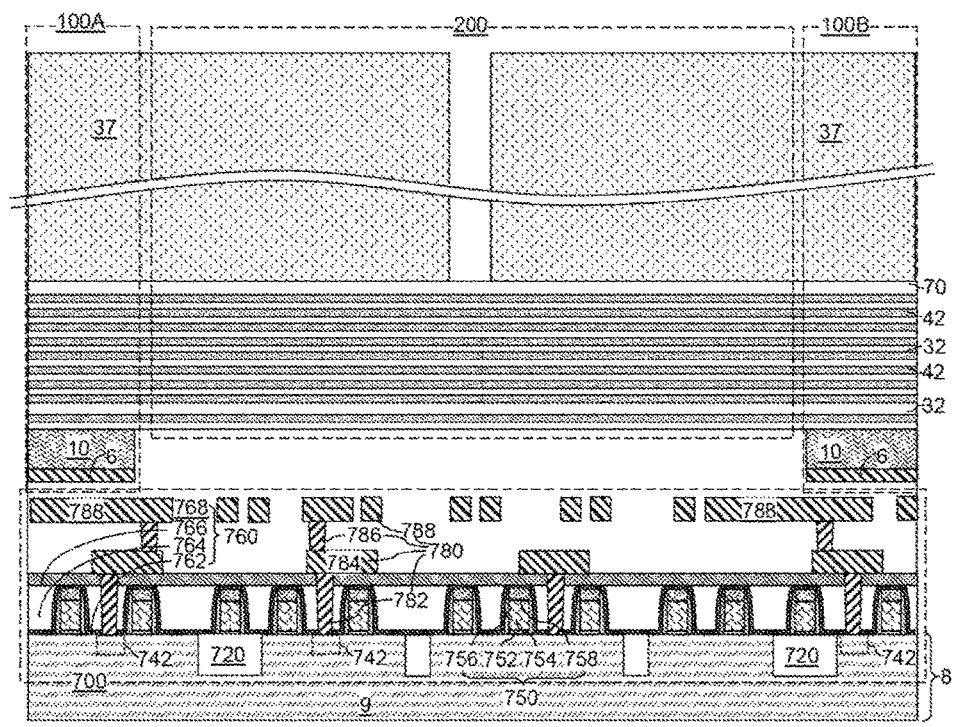
FIG. 3A is a first vertical cross-sectional view of the exemplary structure after formation of a patterned hard mask layer and application and patterning of a trimmable material layer according to an embodiment of the present disclosure.
Figure 3B:
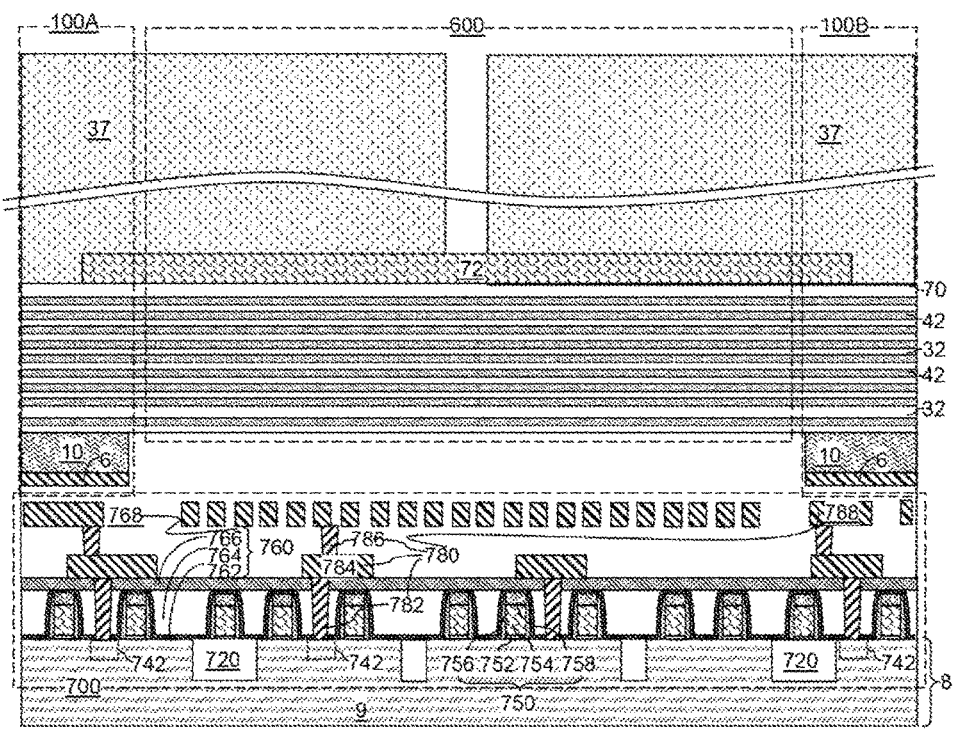
FIG. 3B is a second vertical cross-sectional view of the exemplary structure of FIG. 3A.
Figure 3C:
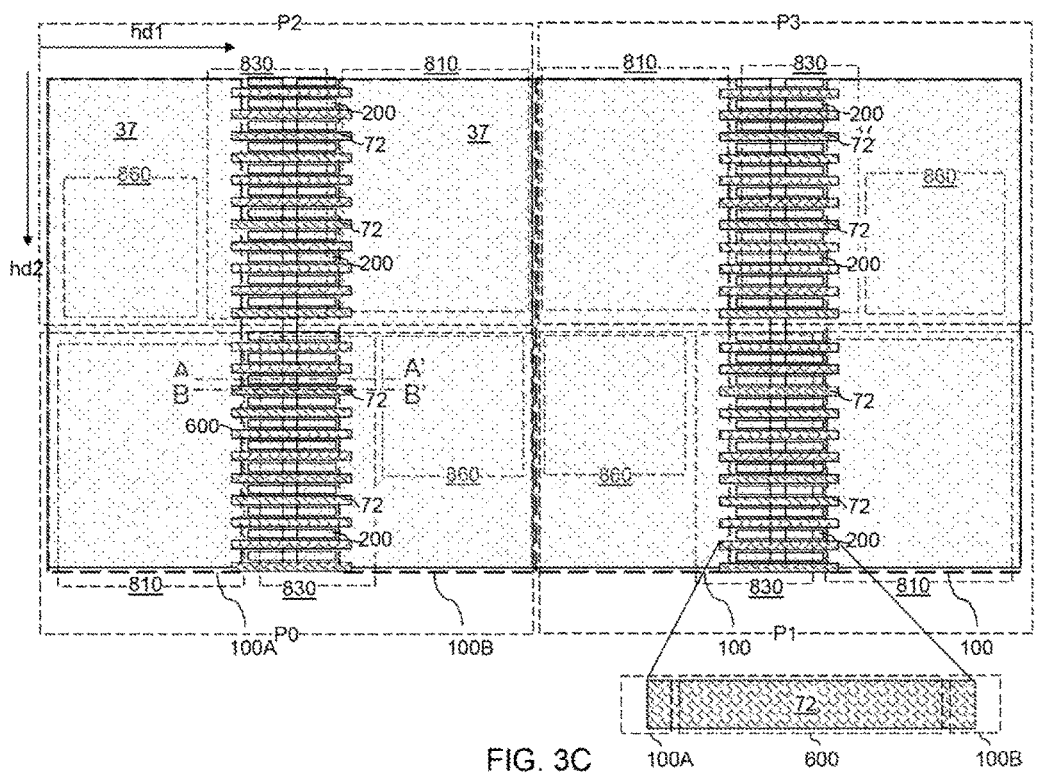
FIG. 3C is a plan view of the exemplary structure of FIGS. 3A and 3B. The vertical plane A-A' corresponds to the plane of the vertical cross-sectional view of FIG. 3A. The vertical plane B-B' corresponds to the plane of the vertical cross-sectional view of FIG. 3B.

Referring to FIGS. 3A-3C, regions located between a neighboring pair of word line contact via regions 200 include connection regions 600. The connection regions 600 are covered with a patterned hard mask layer 72 that includes a different material from the materials of the insulating layers 32 and the sacrificial material layers 42. For example, the patterned hard mask layer 72 can include a semiconductor material such as silicon or a silicon-germanium alloy. For example, the patterned hard mask layer 72 can include polysilicon. The patterned hard mask layer 72 can be formed by depositing a blanket film (i.e., an unpatterned film) of a hard mask material over the insulating cap layer 70, and by applying a photoresist layer thereupon, and by patterning the blanket film employing an etch process that uses the patterned photoresist layer as an etch mask. The photoresist layer can be subsequently removed, for example, by ashing.

A trimmable material layer 37 can be applied over the insulating cap layer 70 and the patterned hard mask layer 72, and can be lithographically patterned to cover the memory opening regions 100 and areas of word line contact via regions 200 in which stepped terraces are to be subsequently formed. The trimmable material layer 37 includes a material that can be incrementally trimmed. For example, the trimmable material layer 37 can include a photoresist layer that can be timed by ashing or by wet etching.

The patterned trimmable material layer 37 covers a first memory array region 100A located on one side of a word line contact via regions 200 and a connection region 600 and a second memory array region 100B located on another side of the connection region 600 and the word line contact via regions 200, and does not cover a center portion of an intermediate region (i.e., region of the word line contact via region(s) 200 and the connection region 600) which extends in the bit line direction and is located between the first memory array region 100A and the second memory array region 100B, as shown in FIG. 3C. The word line contact via region 200 is located adjacent to the connection region 600. Alternatively, plural alternating word line contact via regions 200 and connection regions 600 which alternate in the bit line direction (e.g., the second horizontal direction hd2) which is perpendicular to the word line direction (e.g., the first horizontal direction hd1) may be located in each intermediate region. The pattern of the trimmable material layer 37 as initially formed includes a gap that extends through a center portion of each word line contact via region 200. In one embodiment, each gap in the trimmable material layer as initially formed can have a uniform width, and can laterally extend in the bit line direction hd2 through a set of word line contact via regions 200 and connection regions 600 that are located between two memory array regions 100. In one embodiment, the edges of the trimmable material layer 37 can be located at the location of the bottommost step in the stepped surfaces to be subsequently formed.

Figure 4A:
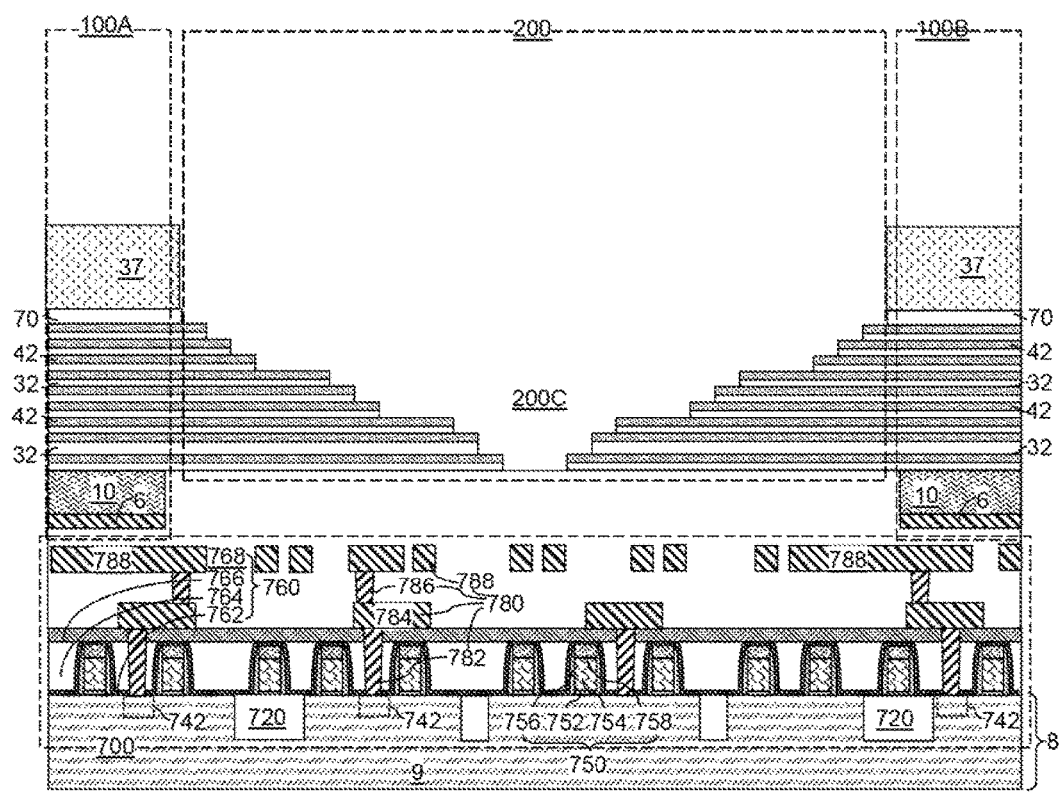
FIG. 4A is a first vertical cross-sectional view of the exemplary structure after formation of terrace regions by repetition of an etch process and a trimming process that trims the trimmable material layer according to an embodiment of the present disclosure.
Figure 4B:
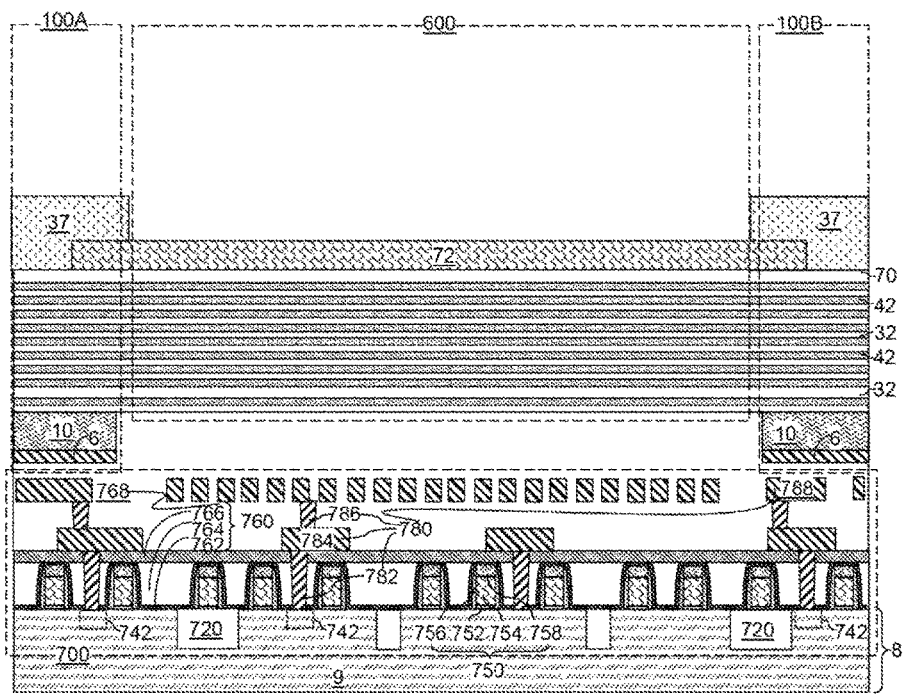
FIG. 4B is a second vertical cross-sectional view of the exemplary structure of FIG. 4A.
Figure 4C:
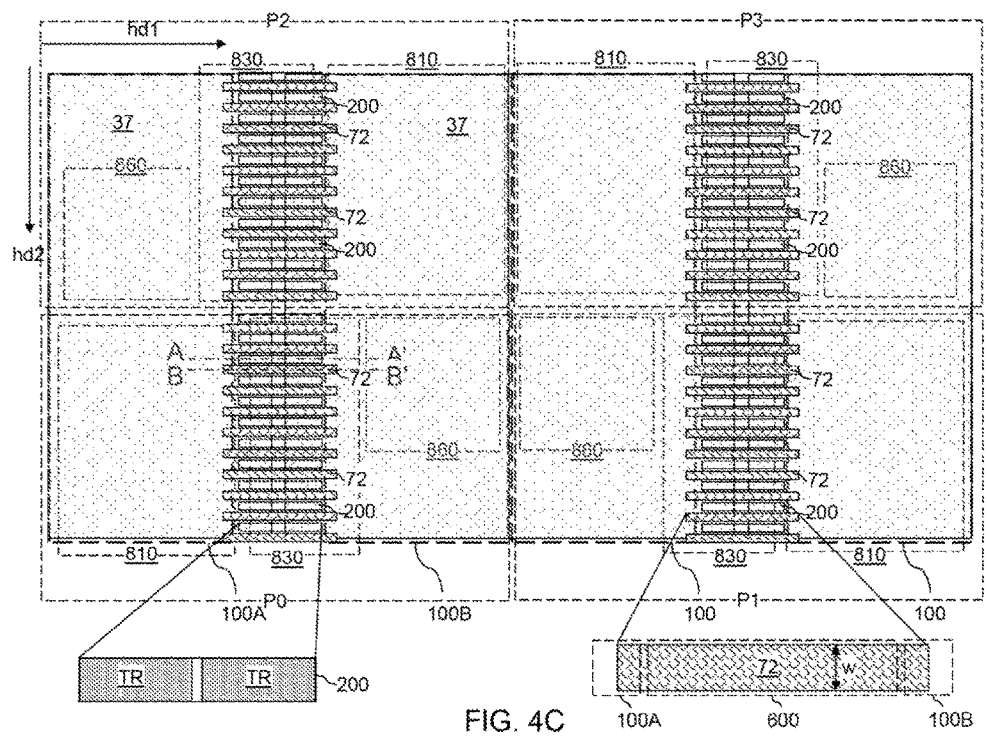
FIG. 4C is a plan view of the exemplary structure of FIGS. 4A and 4B. The vertical plane A-A' corresponds to the plane of the vertical cross-sectional view of FIG. 4A. The vertical plane B-B' corresponds to the plane of the vertical cross-sectional view of FIG. 4B.
Figure 5A:
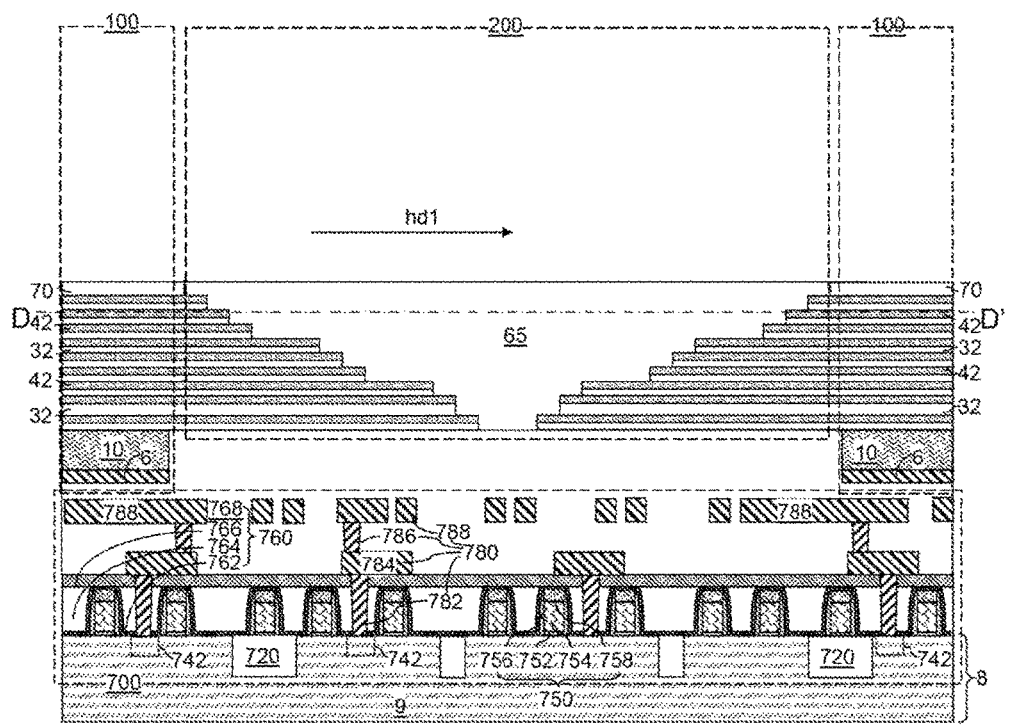
FIG. 5A is a first vertical cross-sectional view of the exemplary structure after formation of retro-stepped dielectric material portions according to an embodiment of the present disclosure.
Figure 5B:
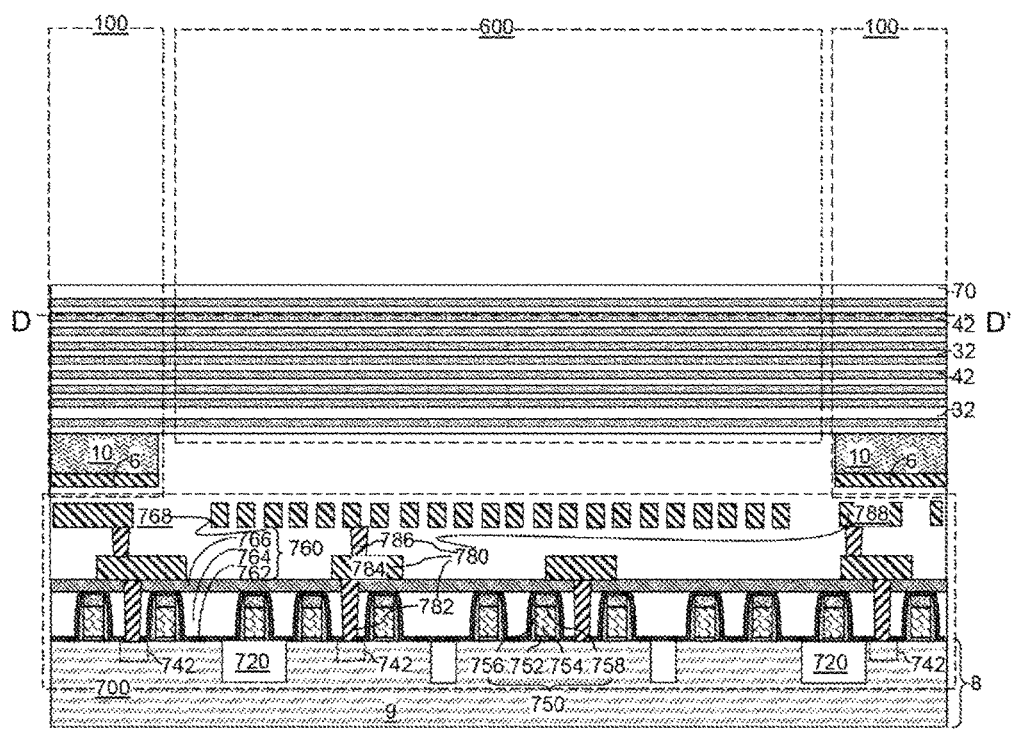
FIG. 5B is a second vertical cross-sectional view of the exemplary structure of FIG. 5A.
Figure 5C:
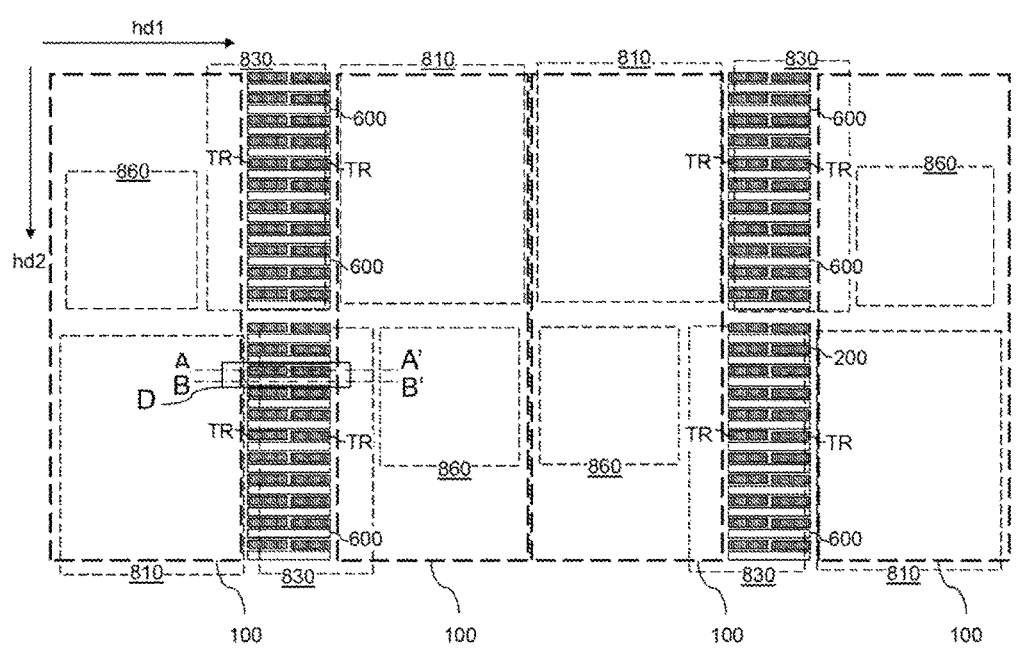
FIG. 5C is a plan view of the exemplary structure of FIGS. 5A and 5B. The vertical plane A-A' corresponds to the plane of the vertical cross-sectional view of FIG. 5A. The vertical plane B-B' corresponds to the plane of the vertical cross-sectional view of FIG. 5B.
Figure 5D:
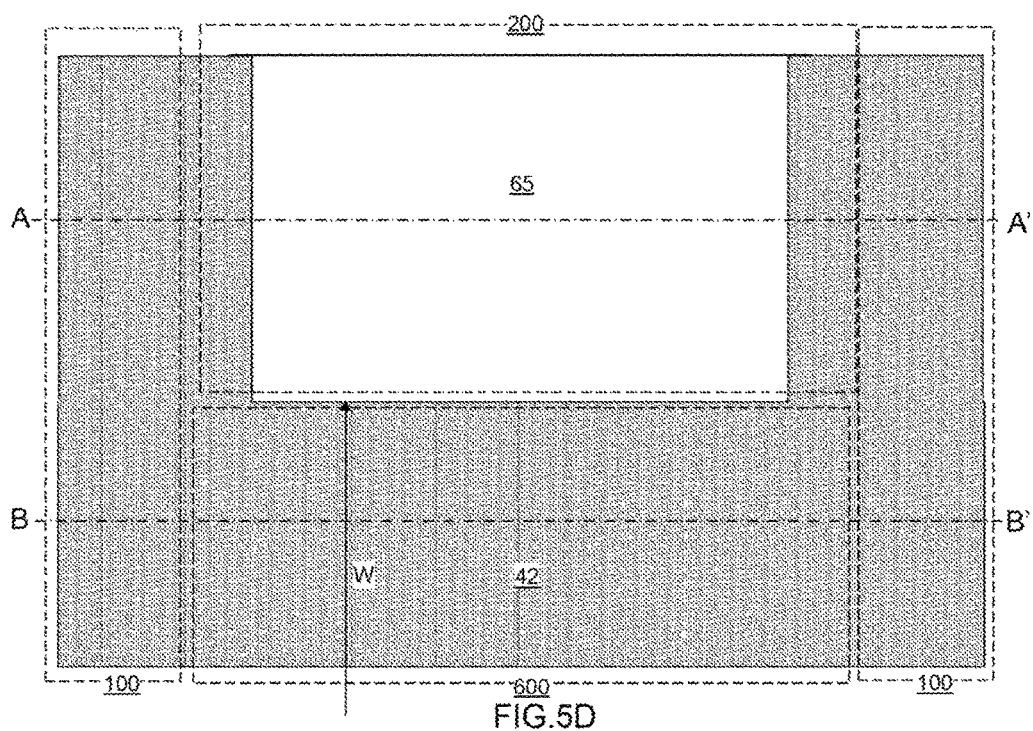
FIG. 5D is a horizontal cross-sectional view of the exemplary structure of FIGS. 5A and 5B along the horizontal plane D-D' in FIGS. 5A and 5B and located in region D in FIG. 5C.

Referring to FIGS. 4A-4C, stepped surfaces are formed within each of the word line contact via regions 200 around the gaps in the trimmable material layer 37. Each region of stepped surfaces is herein referred to terrace region TR. A unit process cycle including an etch process and a trimming process is repeated to form the terrace regions TR. In an illustrative example, each etch process transfers the pre-existing pattern of stepped surfaces by an additional underlying pair of a sacrificial material layer 42 and an insulating layer 32, and the transfers the current pattern of the trimmable material layer 37 through the insulating cap layer 70. Each trimming process trims the material of the trimmable material layer 37 isotropically, thereby laterally shifting the edges of the trimmable material layer 37 outward from each initial gap in the trimmable material layer 42. The trimming distance determines the width of the newest horizontal step to be formed in the next etch process.

The terrace regions TR are simultaneously formed by repetition of the unit process cycle. Thus, each pair of a first terrace region and a second terrace region within a word line contact via region 200 is simultaneously formed by iteratively etching the spacer material layers (i.e., the sacrificial material layers 42) and the insulating layers of the alternating stack (32, 42) and trimming the trimmable material layer 37. The first terrace region can be adjoined to the first memory array region 100A at one side of the intermediate region (i.e., the word line contact via region 200) and a second terrace region adjoined to the second memory array region 100B at another side of the intermediate region. A stepped cavity 200C including a pair of stepped surfaces is formed within each intermediate region (i.e., word line contact via region 200).

The lateral separation distance along the first horizontal direction hd1 (e.g., word line direction) between the first stepped surfaces and the second stepped surfaces increases with a vertical distance from the substrate 8 for the sacrificial material layers 42 and for the insulating layer 32 in the alternating stack (32, 42). In one embodiment, a connection region 600 is laterally spaced from the first and second terrace regions (TR) along the second horizontal direction hd2 (e.g., bit line direction), which can be perpendicular to the first horizontal direction hd1. In one embodiment, each layer within the alternating stack (32, 42) can have the same width w along the second horizontal direction hd2 within the connection region 600.

Subsequently, the trimmable material layer 37 and the patterned hard mask layer 72 are removed. Each of the insulating layers 32 and the spacer material layers 42 within the alternating stack continuously extends in the word line direction hd1 between the first 100A and second 100B memory array regions through the connection region 600. Optionally, dummy stairs (i.e., dummy terrace regions) are formed on opposite sides of the memory array regions 100 (e.g., 100A, 100B) from the first and second terrace regions TR. In one embodiments, there are no electrical connections (e.g., no contact vias) to the word lines exposed in the dummy terrace regions. However, driver circuit elements (e.g., driver transistors) for the NAND select transistor (e.g., source and drain select transistor) may be located in or under the dummy terrace regions in addition to or instead of under the first and second terrace regions TR.

Referring to FIGS. 5A-5D, a dielectric material can be deposited in the stepped cavities 200C and over the insulating cap layer 70. The dielectric material can include a silicon oxide-based dielectric material such as undoped silicate glass (such as silicon oxide deposited by decomposition of tetraethylorthosilicate (TEOS), i.e., a TEOS oxide) or doped silicate glass (such as borosilicate glass, phosphosilicate glass, or borophosphosilicate glass). Portions of the dielectric material formed above the horizontal plane including the top surface of the insulating cap layer 70 can be removed by a planarization process such as chemical mechanical planarization. Each remaining portion of the deposited dielectric material that fills a stepped cavity is herein referred to as a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present.

Each retro-stepped dielectric material portion 65 can include a planar top surface and a pair of stepped bottom surfaces. Each retro-stepped dielectric material portion 65 is located within a respective word line contact via region 200 located (i.e., an intermediate region) between a pair of memory array regions 100 (e.g., 100A and 100B) that are spaced apart along a first horizontal direction hd1, which is the direction along which the height of the stepped surfaces in the terrace regions TR change. At least one of the retro-stepped dielectric material portions 65 can be located between a pair of word line contact via regions 200 that are spaced apart along a second horizontal direction hd2, which can be the direction along which each stepped surface of the terrace regions TR laterally extend.

Each word line contact via region 200 can include first stepped surfaces adjoined to a first memory array region 100A and second stepped surfaces adjoined to a second memory array region 100B. In one embodiment, a retro-stepped dielectric material portion 65 can be formed directly on the first stepped surfaces in the first terrace region and the second stepped surfaces in the second terrace region. A first stepped bottom surface of a retro-stepped dielectric material portion 65 can contact the first stepped surfaces in the first terrace region, and a second stepped bottom surface of the retro-stepped dielectric material portion 65 can contact the second stepped surfaces in the second terrace region. Since there is no stepped cavity 200C in the connection region 600, there is also no retro-stepped dielectric material portion 65 in the connection region 600.

Figure 6A:
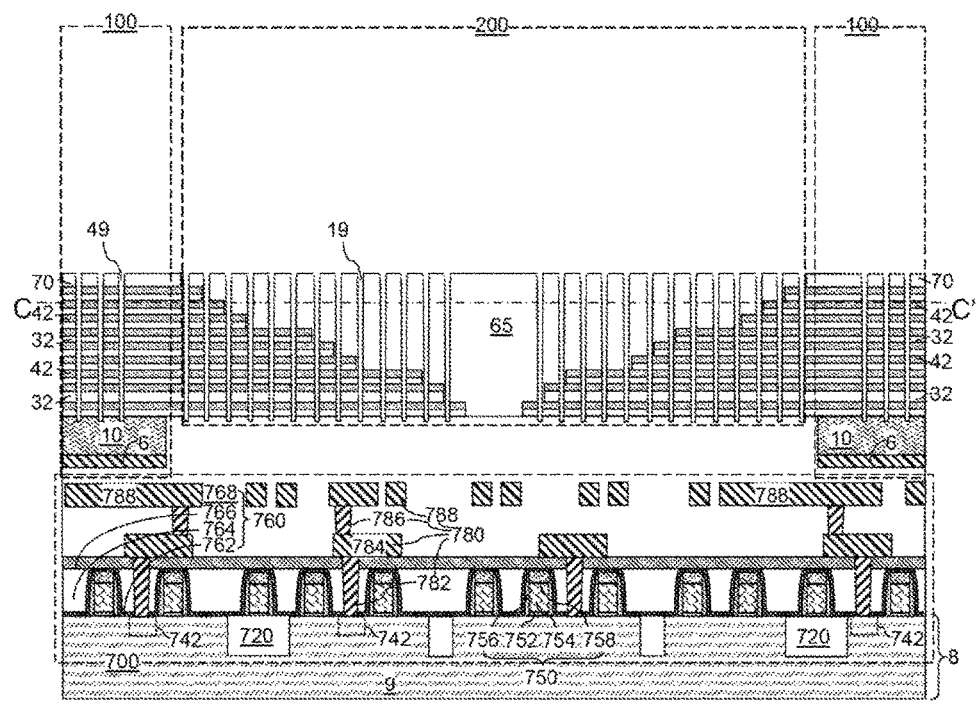
FIG. 6A is a first vertical cross-sectional view of the exemplary structure after formation of memory openings and support openings according to an embodiment of the present disclosure.
Figure 6B:
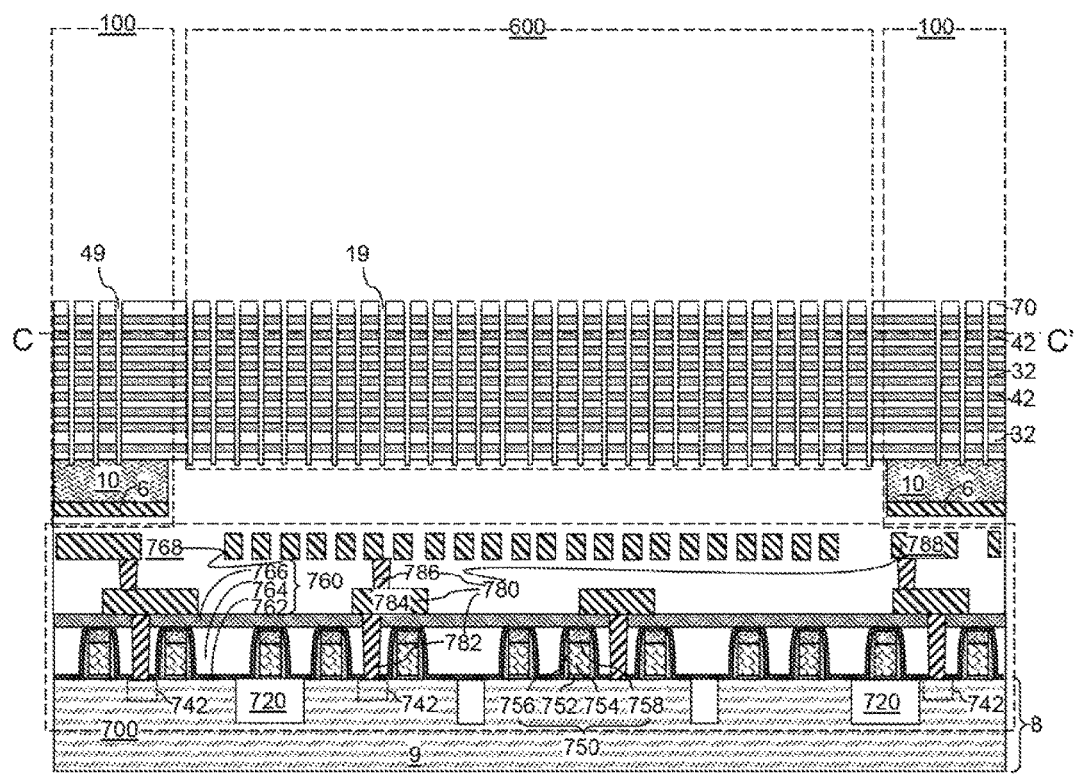
FIG. 6B is a second vertical cross-sectional view of the exemplary structure of FIG. 6A.
Figure 6C:
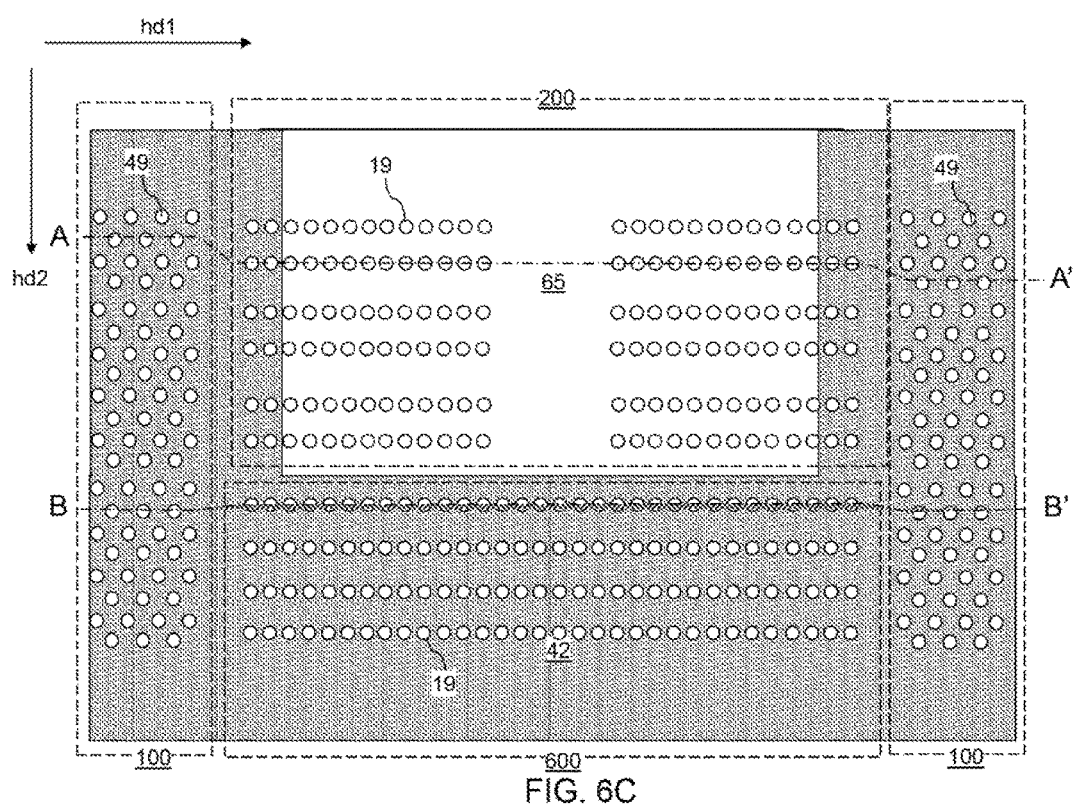
FIG. 6C is a plan view of the exemplary structure of FIGS. 6A and 6B. The vertical plane A-A' corresponds to the plane of the vertical cross-sectional view of FIG. 6A. The vertical plane B-B' corresponds to the plane of the vertical cross-sectional view of FIG. 6B.

Referring to FIGS. 6A-6C, memory openings 49 and first tier support openings 19 can be formed. The memory openings 49 and the support openings 19 extend through the alternating stack (32, 42) at least to a top surface of the planar semiconductor material layer 10. The memory openings 49 can be formed in the memory array regions 100 (e.g., 100A, 100B) at locations at which memory stack structures including vertical stacks of memory elements are to be subsequently formed. The support openings 19 can be formed in the word line contact via regions 200 and in the connection regions 600. In one embodiment, the memory openings 49 can be formed as a two-dimensional periodic array in each of the memory array regions 100. In one embodiment, the support openings 19 can be formed as rows of support openings 19 such that the support openings 19 are arranged along the first horizontal direction hd1 within each row, and the rows are spaced apart along the second horizontal direction hd2. In one embodiment, each of the support openings 19 can extend through a respect one of the horizontal surfaces between a neighboring pair of vertical steps within stepped surfaces of a terrace region TR.

For example, a lithographic material stack (not shown) including at least a photoresist layer can be formed over the insulating cap layer 70, and can be lithographically patterned to form openings within the lithographic material stack. The pattern in the lithographic material stack can be transferred through the insulating cap layer 70, and through the entirety of the alternating stack (32, 42) by at least one anisotropic etch that employs the patterned lithographic material stack as an etch mask. Portions of the insulating cap layer 70 and the alternating stack (32, 42) underlying the openings in the patterned lithographic material stack are etched to form the memory openings 49 and the support openings 19. In other words, the transfer of the pattern in the patterned lithographic material stack through the insulating cap layer 70 and the alternating stack (32, 42) forms the memory openings 49 and the support openings 19.

In one embodiment, the chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches or a single etch (e.g., $CF_4/O_2/Ar$ etch). The sidewalls of the memory openings 49 and the support openings 19 can be substantially vertical, or can be tapered. Subsequently, the patterned lithographic material stack can be subsequently removed, for example, by ashing.

FIGS. 7A-7H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 7A, a memory opening 49 in the exemplary device structure of FIGS. 4A and 4B is illustrated. The memory opening 49 extends through the insulating cap layer 70, the alternating stack (32, 42), and into an upper portion of the planar semiconductor material layer 10. At this processing step, each support opening 19 can extend through the retro-stepped dielectric material portion 65, a subset of layers in the alternating stack (32, 42), and into an upper portion of the at least one lower level interconnect dielectric layer 768. The recess depth of the bottom surface of each memory opening with respect to the top surface of the planar semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 7B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the planar semiconductor material layer 10. In one embodiment, the pedestal channel portion 11 can be doped with electrical dopants of the same conductivity type as the planar semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate 8 and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the planar semiconductor material layer 10 that the pedestal channel portion 11 contacts. If a planar semiconductor material layer 10 is not present, the pedestal channel portion 11 can be formed directly on the substrate semiconductor layer 9, which can have a doping of the first conductivity type.

In one embodiment, the bottom surfaces of the support openings 19 are surfaces of the at least one lower level interconnect dielectric layer 768. As such, selective growth of a semiconductor material does not occur at the bottom of the support openings 19. Thus, pedestal channel portions are not formed in the support openings 19.

Figure 7C:
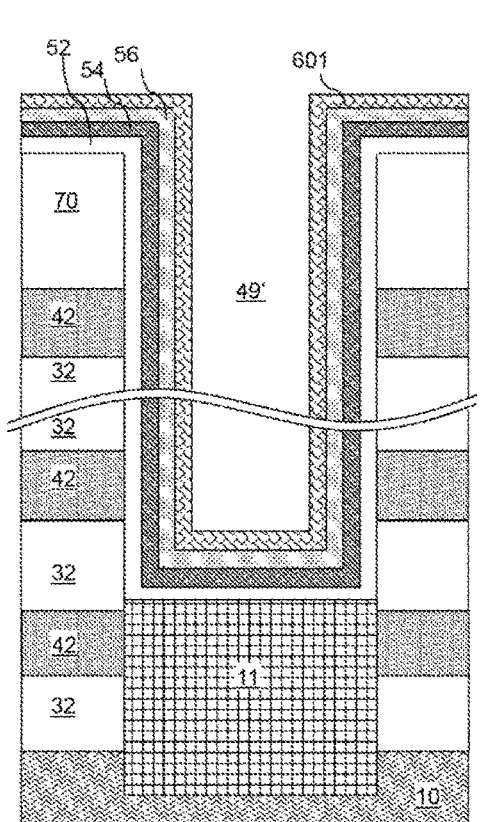

Referring to FIG. 7C, a stack of layers including a blocking dielectric layer 52, a charge storage layer 54, a tunneling dielectric layer 56, and an optional first semiconductor channel layer 601 can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Figure 7D:
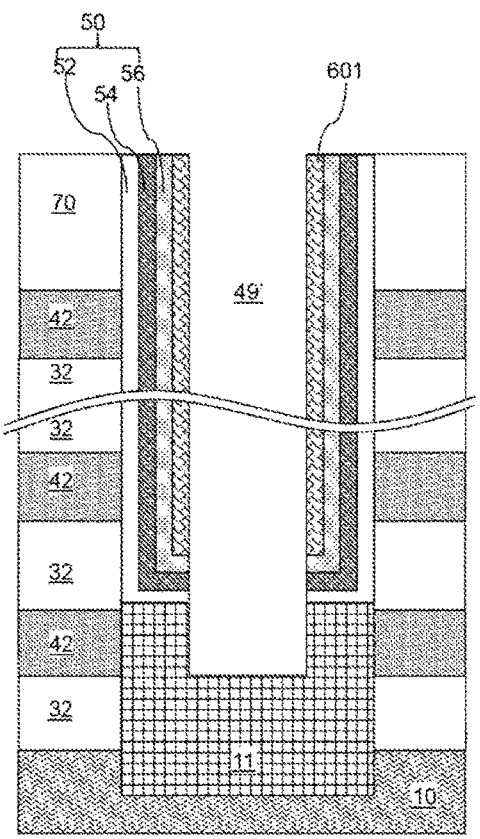

Referring to FIG. 7D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the planar semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 7E:
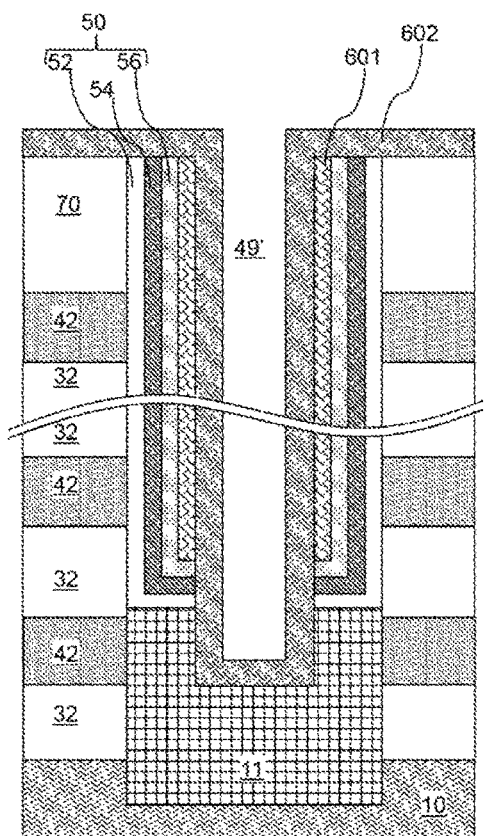

Referring to FIG. 7E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 7F:
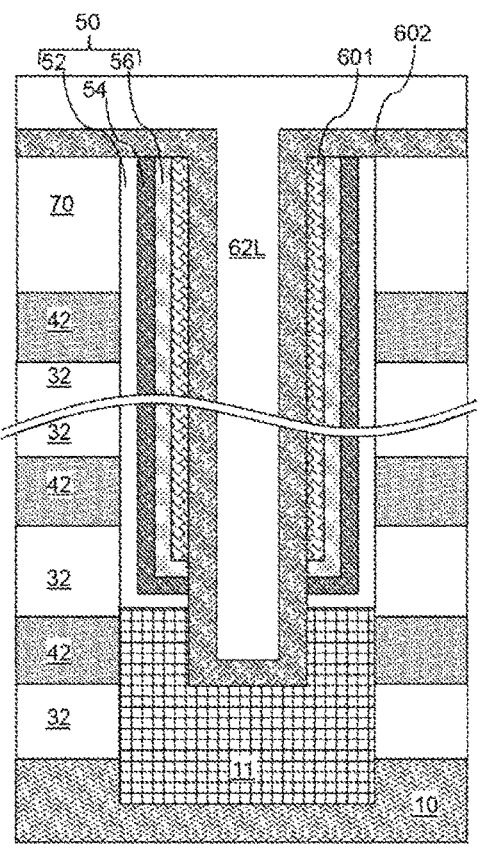

Referring to FIG. 7F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 7G:
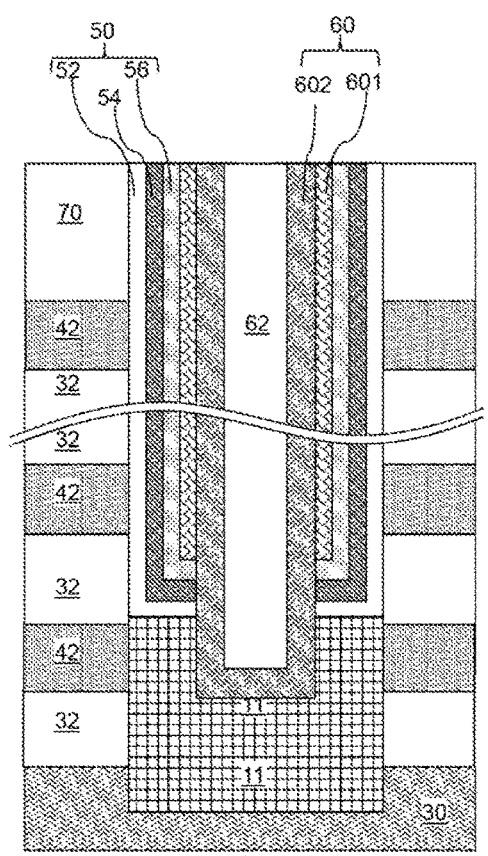

Referring to FIG. 7G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirely within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 7H:
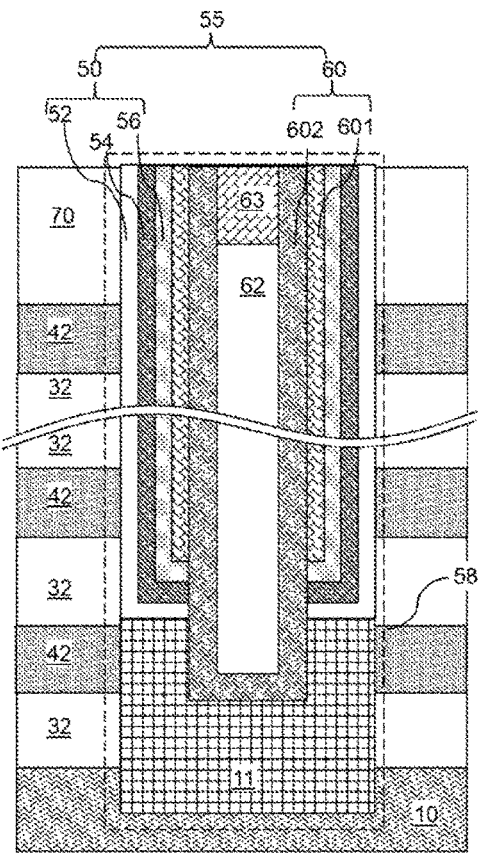

Referring to FIG. 7H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58.

Figures 7I, 7J:
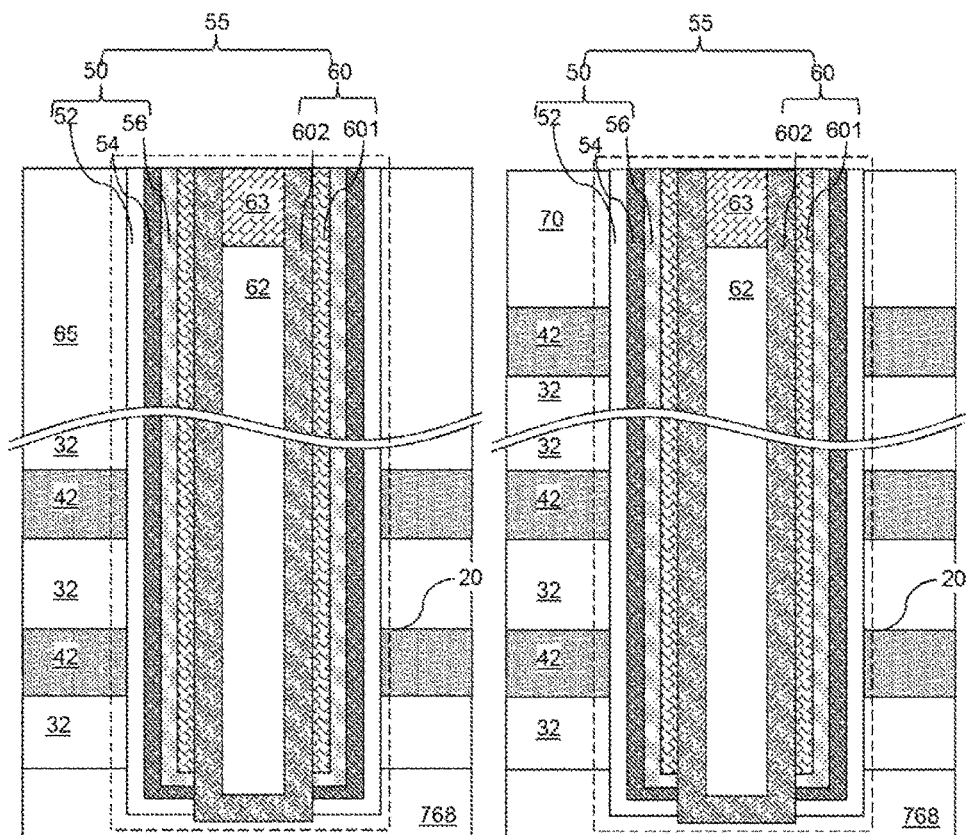
FIG. 7I is a vertical cross-sectional view of a support pillar structure in a word line contact via region according to an embodiment of the present disclosure.
FIG. 7J is a vertical cross-sectional view of a support pillar structure in a connection region according to an embodiment of the present disclosure.

As discussed above, pedestal channel portions are not formed at the bottom of the support openings 19 because the bottom surfaces of the support openings 19 are surfaces of the at least one lower level interconnect dielectric layer 768. Each support openings 19 is filled with a memory film 50, a vertical semiconductor channel 60, a dielectric core 62, and a drain region 63, which collectively constitute a support pillar structure 20. A support pillar structure 20 formed in a word line contact via region 200 is illustrated in FIG. 7I. A predominant subset (i.e., a subset that includes more than 50% of all elements of the entire set) of support pillar structures 20 in the word line contact via regions 200 extend through less than all layers within the alternating stack (32, 42) and through a retro-stepped dielectric material portion 65. A support pillar structure 20 formed in a connection region 600 is illustrated in FIG. 7J. All of the support pillar structures 20 formed in connection regions 600 can extend through each layer within the alternating stack (32, 42), and does not contact any retro-stepped dielectric material portion 65.

Figure 8A:
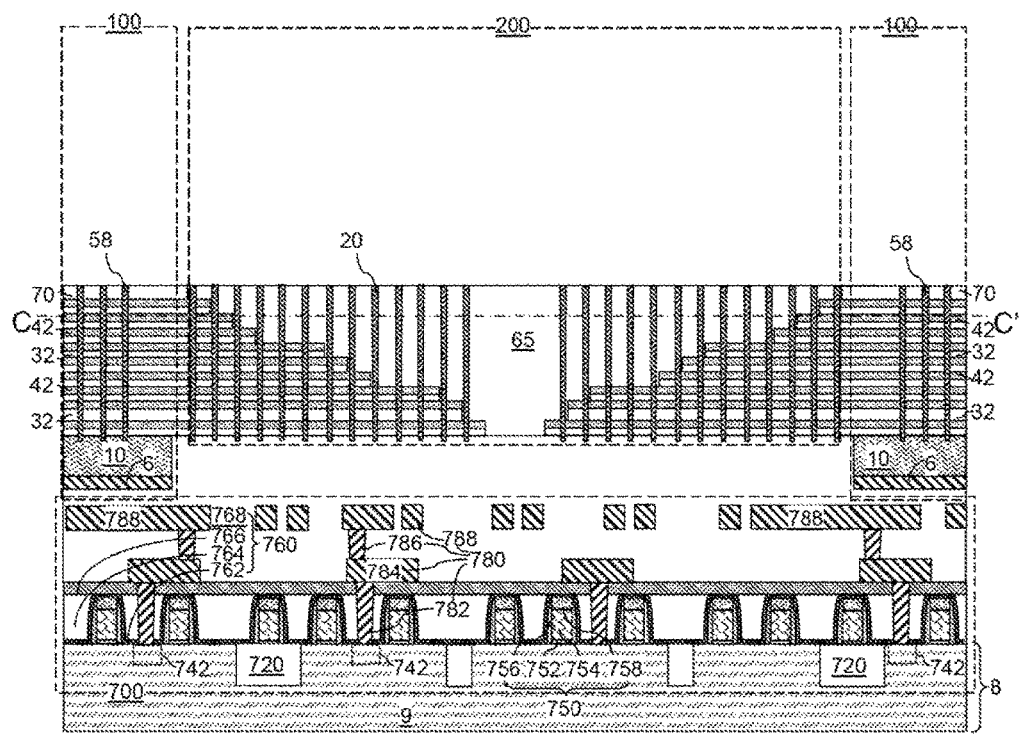
FIG. 8A is a first vertical cross-sectional view of the exemplary structure after formation of memory stack structures and support pillars according to an embodiment of the present disclosure.
Figure 8B:
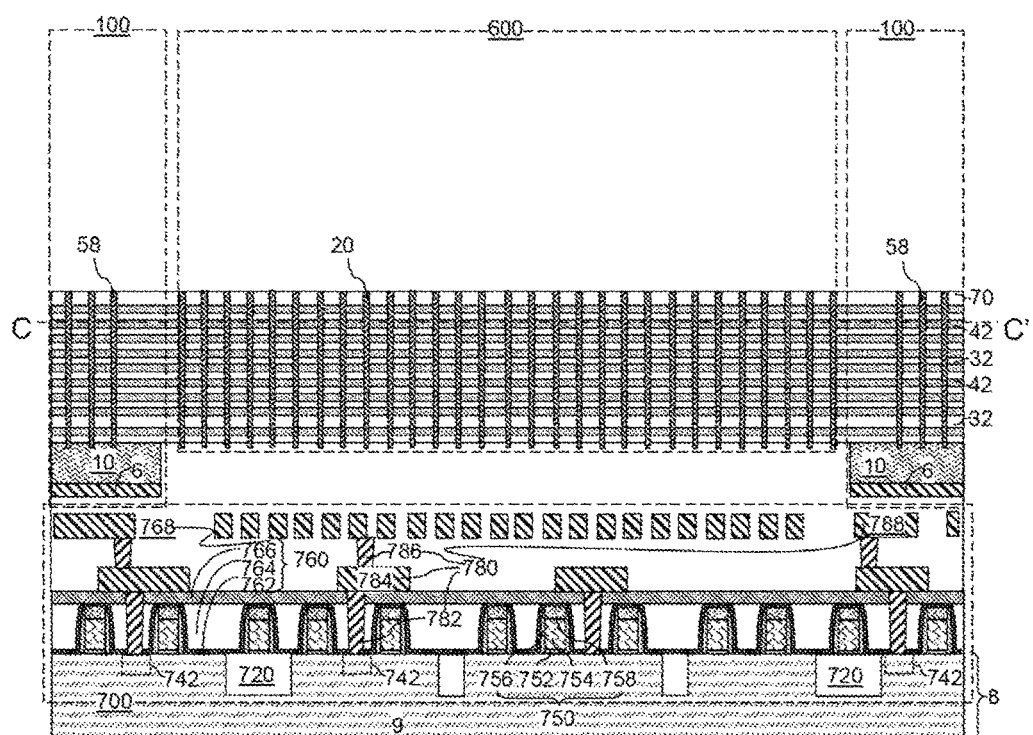
FIG. 8B is a second vertical cross-sectional view of the exemplary structure of FIG. 8A.
Figure 8C:
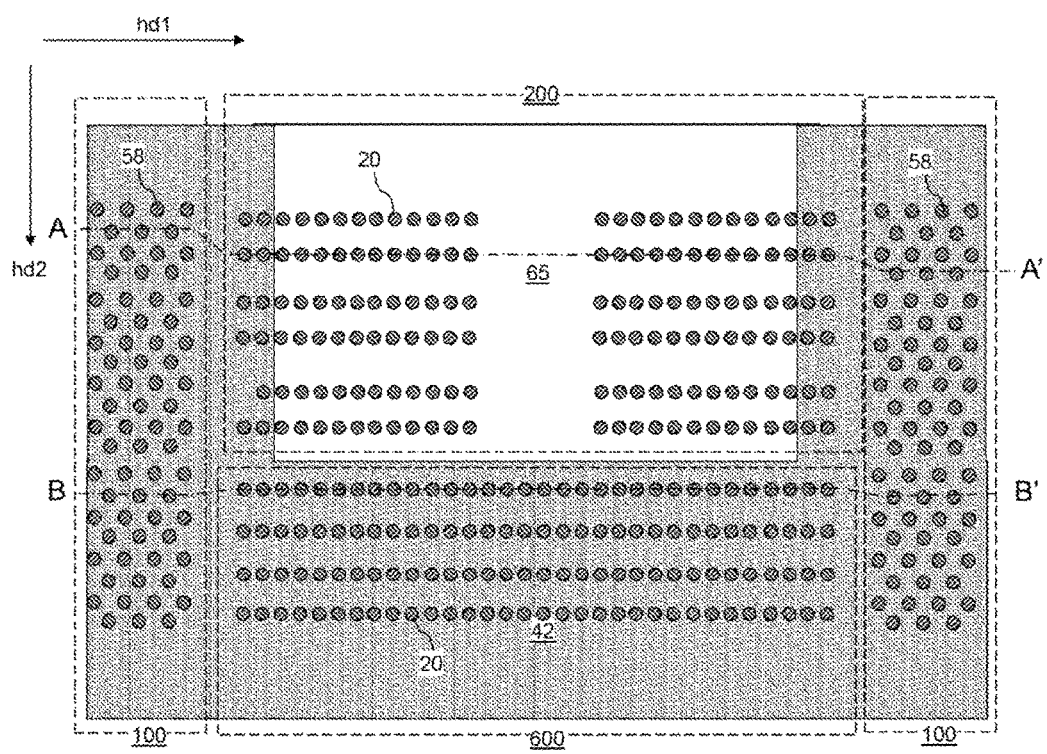
FIG. 8C is a plan view of the exemplary structure of FIGS. 8A and 8B. The vertical plane A-A' corresponds to the plane of the vertical cross-sectional view of FIG. 8A. The vertical plane B-B' corresponds to the plane of the vertical cross-sectional view of FIG. 8B.

Referring to FIGS. 8A-8C, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 6A-6C. An instance of the support pillar structure 20 can be formed within each support opening 19 of the structure of FIGS. 6A-6C.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

In one embodiment, within each plane (P0, P1, P2, P3), first memory stack structures in the first memory array region and second memory stack structures in the second memory array region. The first memory array region and the second memory array region can be laterally spaced from each other along a first horizontal direction hd1. The connection region 600 can be laterally spaced from the first and second terrace regions along a second horizontal direction hd2 that is perpendicular to the first horizontal direction hd1. In one embodiment, each layer within the alternating stack (32, 42) can have the same width along the second horizontal direction hd2 within the connection region 600.

Figure 9A:
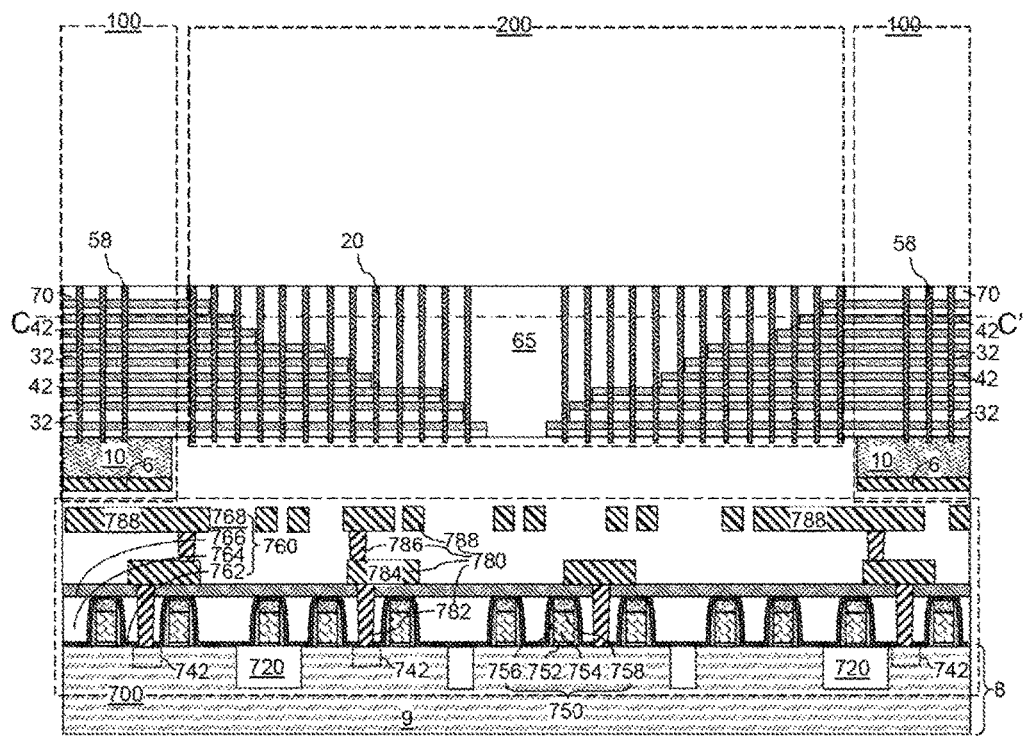
FIG. 9A is a first vertical cross-sectional view of the exemplary structure after formation of backside trenches according to an embodiment of the present disclosure.
Figure 9B:
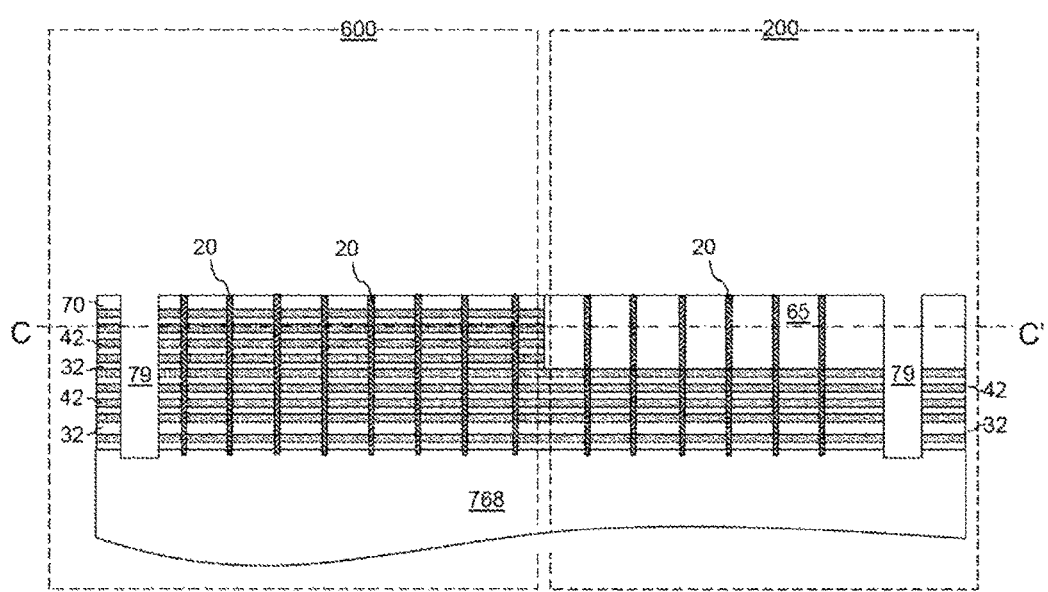
FIG. 9B is a second vertical cross-sectional view of the exemplary structure of FIG. 9A.

Referring to FIGS. 9A-9C, A photoresist layer (not shown) can be applied over the insulating cap layer 70, and is lithographically patterned to form openings in areas between clusters of memory stack structures 55. The pattern in the photoresist layer can be transferred through the insulating cap layer 70, the alternating stack (32, 42) and/or the retro-stepped dielectric material portion 65 employing an anisotropic etch to form backside trenches 79, which vertically extend from the top surface of the insulating cap layer 70 at least to the top surface of the planar semiconductor material layer 10 or the top surface of the at least one lower level interconnect dielectric layer 768, and laterally extend through the memory array region 100 and the word line contact via regions 200. In one embodiment, the backside trenches 79 can include a source contact opening in which a source contact via structure can be subsequently formed. The photoresist layer can be removed, for example, by ashing.

In one embodiment, the backside trenches 79 can laterally extend along the first horizontal direction hd1. A subset of the backside trenches 79 can laterally extend through a respective one of the word line contact via regions 200. Another subset of the backside trenches 79 can laterally extend through a respective one of the connection regions 600. In this case, a connection region 600 can be divided into regions that are laterally spaced apart by a backside trench 79. The portions of the insulating layers 32 and the sacrificial material layers 42 within each connection region 600 can have a uniform width w' along the direction that is parallel to a backside trench 79 and a vertical interface between a retro-stepped dielectric material portion 65 and the alternating stack (32, 42) that extends along the first horizontal direction hd1.

Each of the backside trenches 79 can laterally extend along the first horizontal direction hd1 and vertically extend from the bottommost layer of the alternating stack (32, 42) to the topmost layer of the alternating stack (32, 42). In one embodiment, a first backside trench 79A and a second backside trench 79B can be formed through the alternating stack (32, 42). The first backside trench 79A can straddle an intermediate region between a first memory array region 100A and a second memory array region 100B (i.e., a word line contact via region 200), the first memory array region 100A, and the second memory array region 100B, and the second backside trench 79B can straddle the connection region 600, the first memory array region 100A, and the second memory array region 100B. In one embodiment, a first one of the pair of backside trenches 79 (i.e., the first backside trench 79A) can have a sidewall that contacts a first subset of sidewalls of the alternating stack (32, 42) in the first memory array region 100A, in the second memory array region 100B, in the first terrace region TR1, and in the second terrace region TR2. A second one of the pair of backside trenches 79 (i.e., the second backside trench 79B) can have a sidewall that contacts a second subset of sidewalls of the alternating stack (32, 42) in the first memory array region 100A, in the second memory array region 100B, in the connection region 600.

Figure 10A:
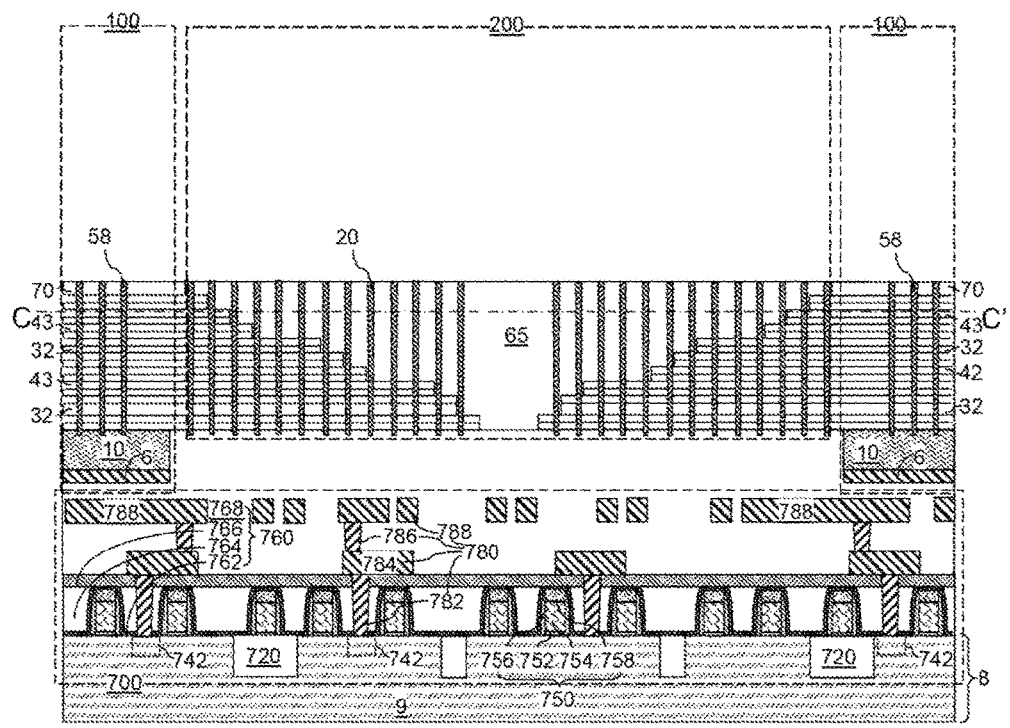
FIG. 10A is a first vertical cross-sectional view of the exemplary structure after formation of backside recesses according to an embodiment of the present disclosure.
Figure 10B:
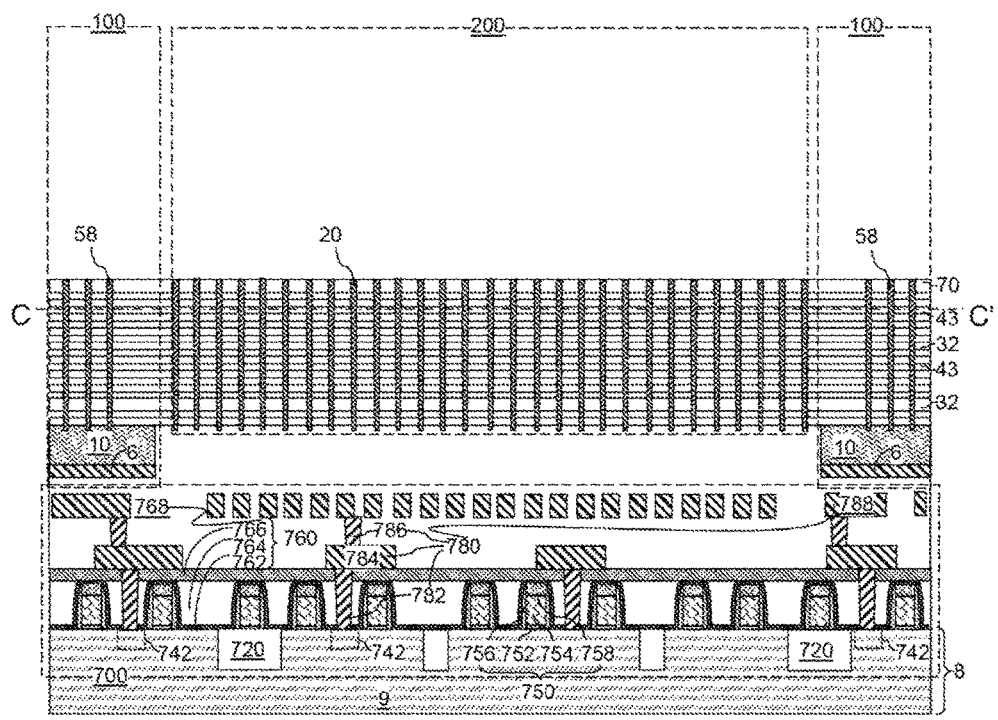
FIG. 10B is a second vertical cross-sectional view of the exemplary structure of FIG. 10A.
Figure 10C:
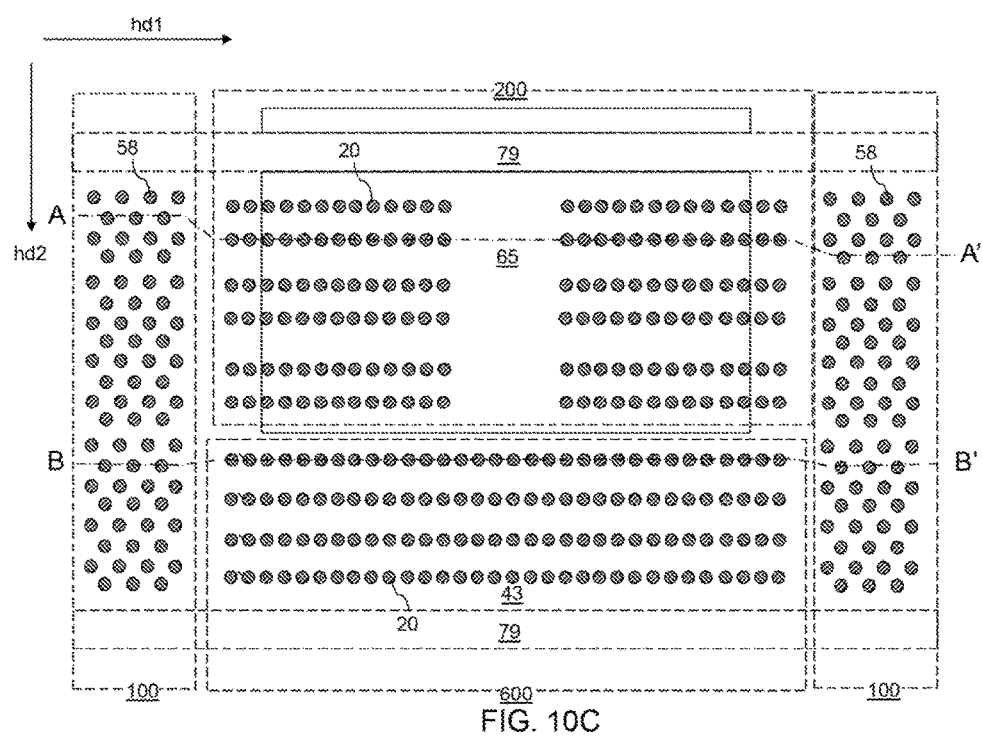
FIG. 10C is a plan view of the exemplary structure of FIGS. 10A and 10B. The vertical plane A-A' corresponds to the plane of the vertical cross-sectional view of FIG. 10A. The vertical plane B-B' corresponds to the plane of the vertical cross-sectional view of FIG. 10B.

Referring to FIGS. 10A-10C, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portions 65, the material of the semiconductor material of the planar semiconductor material layer 10, the material of the topmost layer of the at least one lower level interconnect dielectric layer 768, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, each of the memory array regions 100 comprises an array of monolithic three-dimensional NAND strings having a plurality of device levels disposed above the substrate 8. In this case, each backside recess 43 can define a space for receiving a respective word line of the array of monolithic three-dimensional NAND strings.

Each of the plurality of backside recesses 43 can extend substantially parallel to the top surface of the substrate 8. A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the planar semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer (not explicitly shown), and to convert each physically exposed surface portion of the planar semiconductor material layer 10 into a planar dielectric portion (not explicitly shown).

Referring to FIGS. 11A-11E, a backside blocking dielectric layer (not shown) can be optionally formed. The backside blocking dielectric layer, if present, comprises a dielectric material that functions as a control gate dielectric for the control gates to be subsequently formed in the backside recesses 43. At least one metallic material can be deposited in the backside recesses 43, at peripheral regions of the backside trenches 79, and over the insulating cap layer 70. For example, the at least one metallic material can include a metallic barrier layer and a metal fill material. The metallic barrier layer includes an electrically conductive metallic material that can function as a diffusion barrier layer and/or adhesion promotion layer for a metallic fill material to be subsequently deposited. For example, the metallic barrier layer can include a conductive metallic nitride material such as TiN, TaN, WN, or a stack thereof, or can include a conductive metallic carbide material such as TiC, TaC, WC, or a stack thereof. The metal fill material is deposited in the remaining volumes of the backside recesses 43, on the inner sidewalls of the metallic barrier layer in the backside trenches 79, and over the portion of the metallic barrier layer overlying the insulating cap layer 70. In one embodiment, the metallic fill material can consist essentially of at least one elemental metal such as tungsten, cobalt, ruthenium, titanium, and tantalum, or can include an intermetallic alloy of at least two elemental metals.

A plurality of electrically conductive layers 46 can be formed in the plurality of backside recesses 43, and a continuous metallic material layer can be formed on the sidewalls of each backside trench 79 and over the insulating cap layer 70. Each electrically conductive layer 46 includes a portion of the metallic barrier layer and a portion of the metallic fill material layer, and can be located between a vertically neighboring pair of dielectric material layers, which can be a pair of insulating layers 32, or a topmost insulating layer 32 and the insulating cap layer 70. Each sacrificial material layer 42 can be replaced with an electrically conductive layer 46. A backside cavity is present in the portion of each backside trench 79 that is not filled with the backside blocking dielectric layer and the continuous metallic material layer.

Subsequently, the deposited metallic material of the continuous electrically conductive material layer is etched back from the sidewalls of each backside trench 79 and from above the insulating cap layer 70, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

An insulating material layer can be formed in each backside trench 79 and over the insulating cap layer 70 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the insulating cap layer 70 and at the bottom of each backside trench 79. Each remaining portion of the insulating material layer constitutes an insulating spacer 74. A backside cavity is present within a volume surrounded by each insulating spacer 74. The anisotropic etch process can continue to remove any additional dielectric material portion, if any, between the backside trenches 79 and the planar semiconductor material layer 10. Thus, a top surface of the planar semiconductor material layer 10 can be physically exposed at the bottom of each backside trench 79.

A source region 61 can be formed at a surface portion of the semiconductor material layer 10 under each backside cavity by implantation of electrical dopants into physically exposed surface portions of the planar semiconductor material layer 10. Each source region 61 is formed in a surface portion of the planar semiconductor material layer 10 that underlies a respective insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor material layer 10. Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. The backside contact via structures 76 can be formed by depositing at least one conductive material in the remaining unfilled volume (i.e., the backside cavity) of each backside trench 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the insulating cap layer 70 overlying the alternating stack (32, 46) as a stopping layer. If chemical mechanical planarization (CMP) process is employed, the insulating cap layer 70 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61.

Figure 11A:
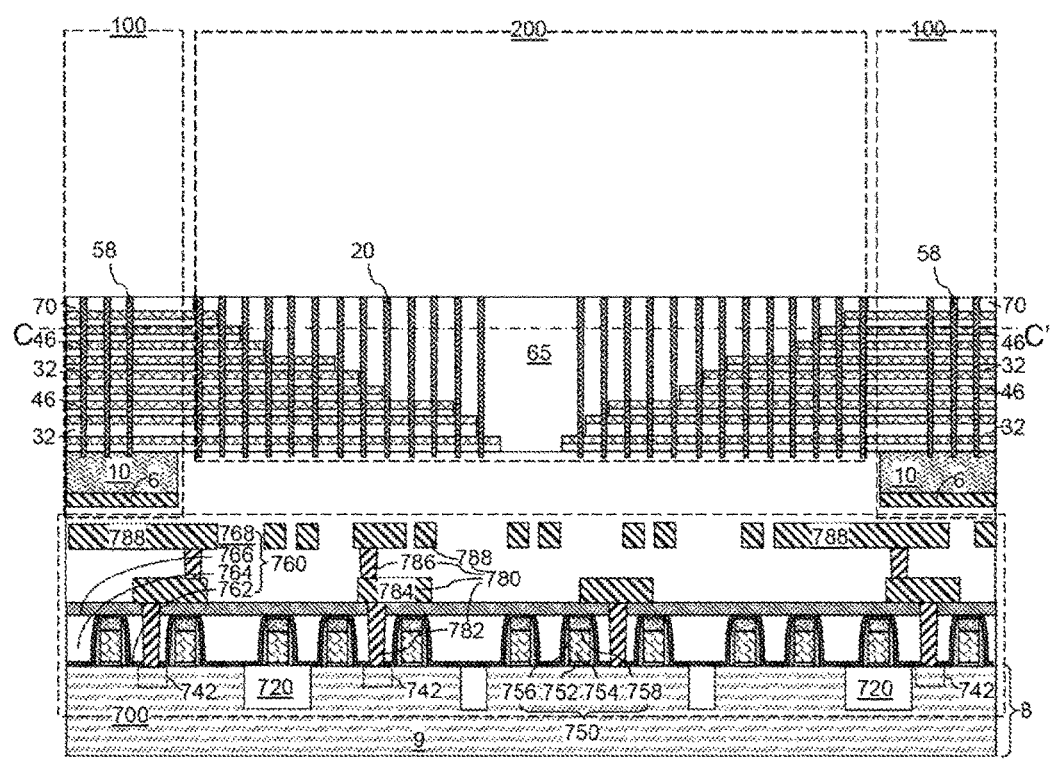
FIG. 11A is a first vertical cross-sectional view of the exemplary structure after formation of electrically conductive layers, insulating spacers, source regions, and backside contact via structures according to an embodiment of the present disclosure.
Figure 11B:
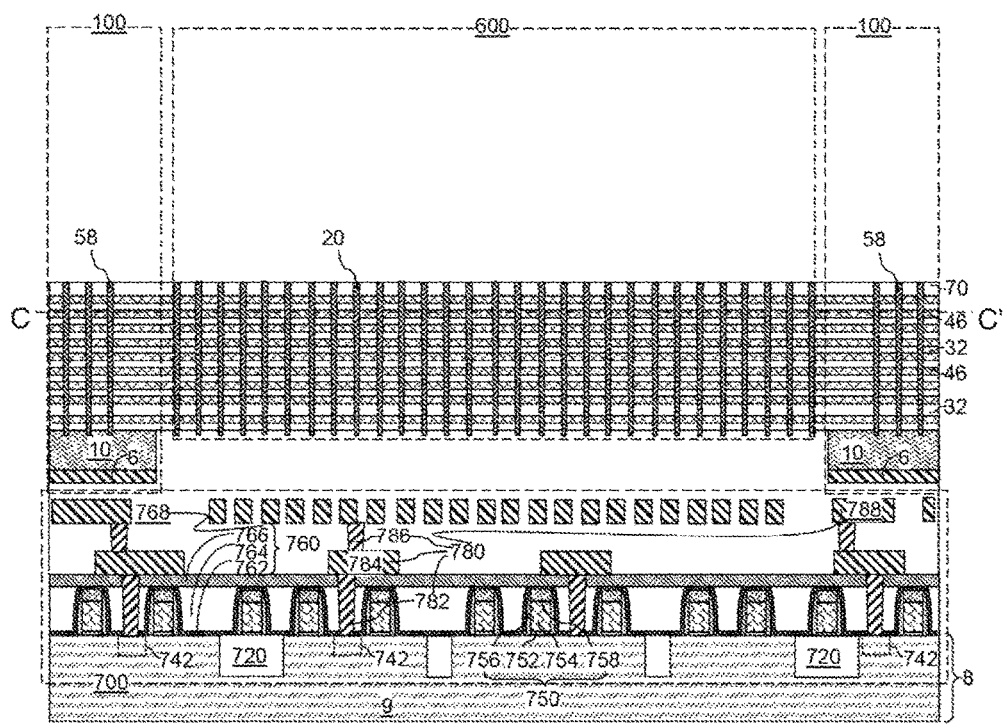
FIG. 11B is a second vertical cross-sectional view of the exemplary structure of FIG. 11A.
Figure 11C:
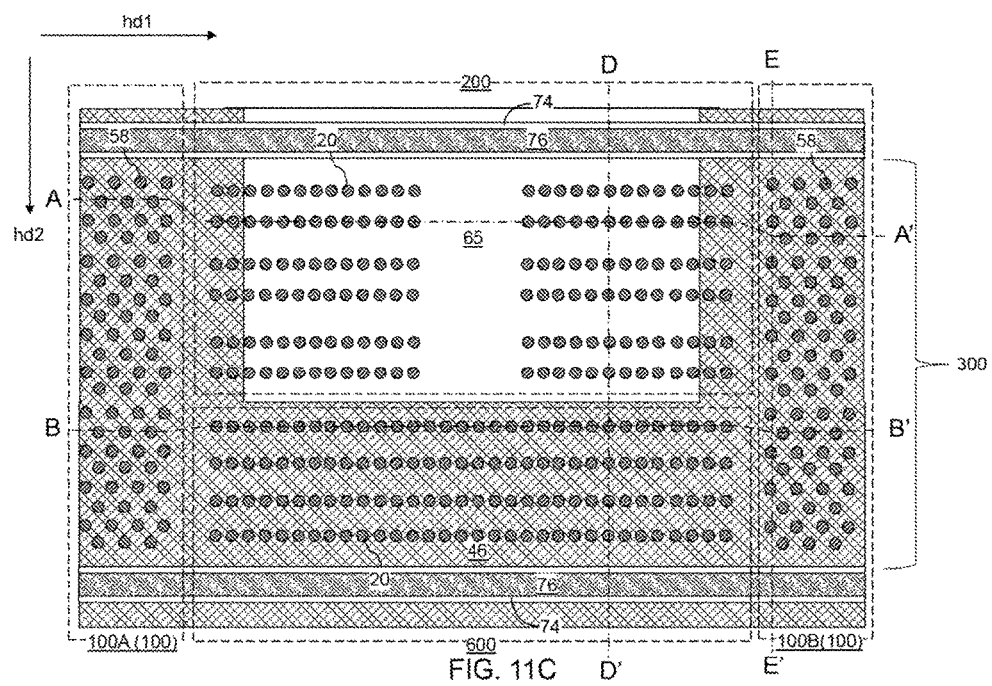
FIG. 11C is a plan view of the exemplary structure of FIGS. 11A and 11B. The vertical plane A-A' corresponds to the plane of the vertical cross-sectional view of FIG. 11A. The vertical plane B-B' corresponds to the plane of the vertical cross-sectional view of FIG. 11B. The vertical plane D-D' corresponds to the plane of the vertical cross-sectional view of FIG. 11D. The vertical plane E-E' corresponds to the plane of the vertical cross-sectional view of FIG. 11E.
Figure 11D:
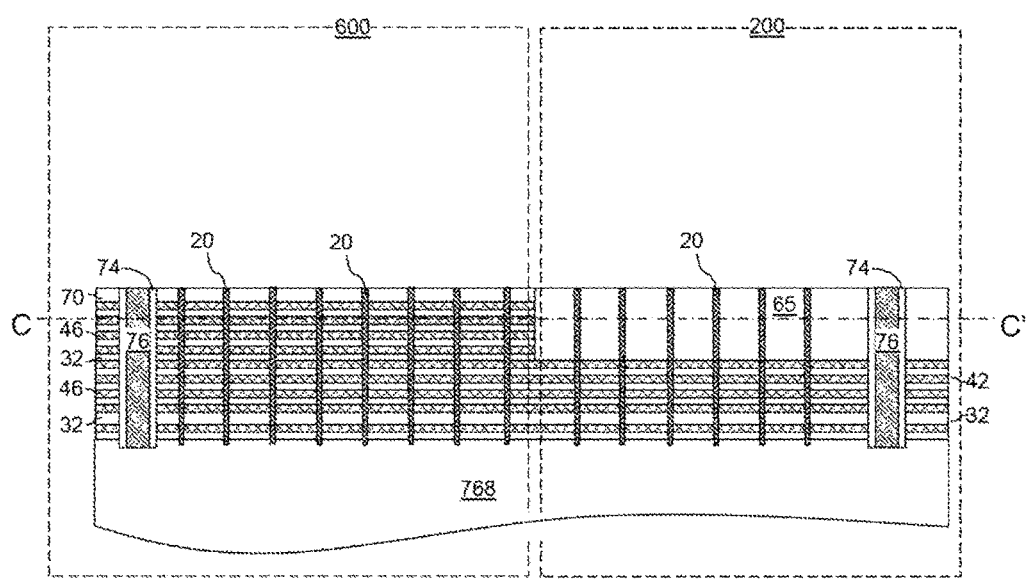
FIG. 11D is a third vertical cross-sectional view of the exemplary structure of FIGS. 11A-11C.
Figure 11E:
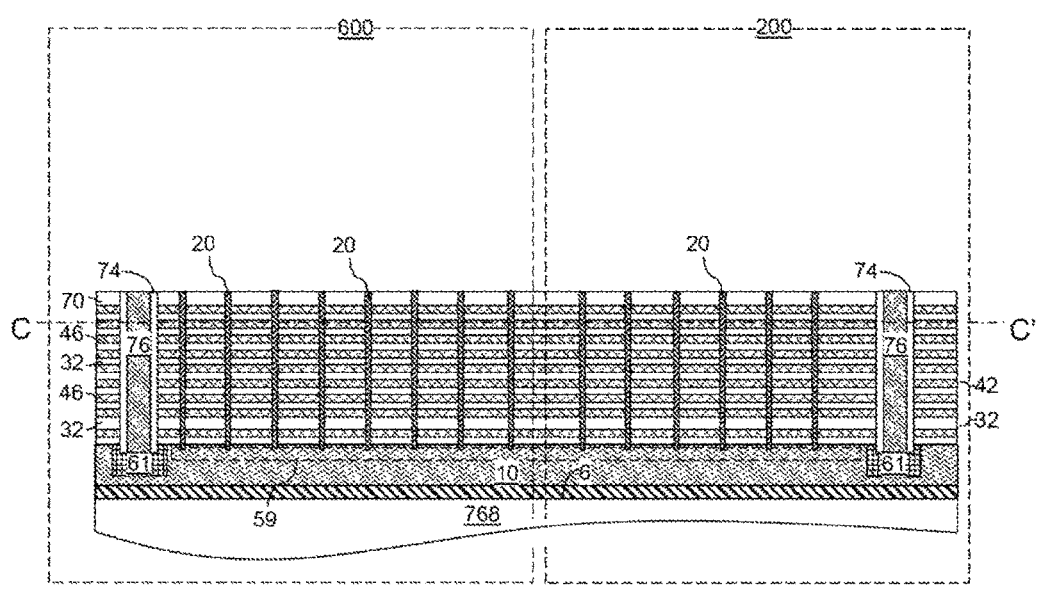
FIG. 11E is a fourth vertical cross-sectional view of the exemplary structure of FIGS. 11A-11C.

Each of the insulating layers 32 and the electrically conductive layers 46 within the alternating stack (32, 46)

continuously extends in the word line direction hd1 between the first and second memory array regions (100A, 100B) in the connection region 600 after formation of the electrically conductive layers 46 and after formation of the first and second memory stack structures 55 in the first and second memory array regions (100A, 100B), respectively. As shown in FIG. 11C, a memory block 300 is located between adjacent backside trenches 79 containing a backside contact via structure 76. Alternatively, the memory block 300 may be separated into several (e.g., two or four) regions by at least one (e.g., one or three) additional backside trenches 79 containing a respective backside contact via structure 76. Each of the insulating layers 32 and the electrically conductive layers 46 within the alternating stack (32, 46) continuously extends in the word line direction hd1 between the first and second memory array regions (100A, 100B) in the connection region 600 in each memory block 300. In one embodiment, the connection region 600 may extend to adjacent memory blocks 300 by forming the patterned hard mask layer 72 that is located over the area of two adjacent memory blocks 300 at the step shown in FIGS. 3B and 3C.

Figure 12A:
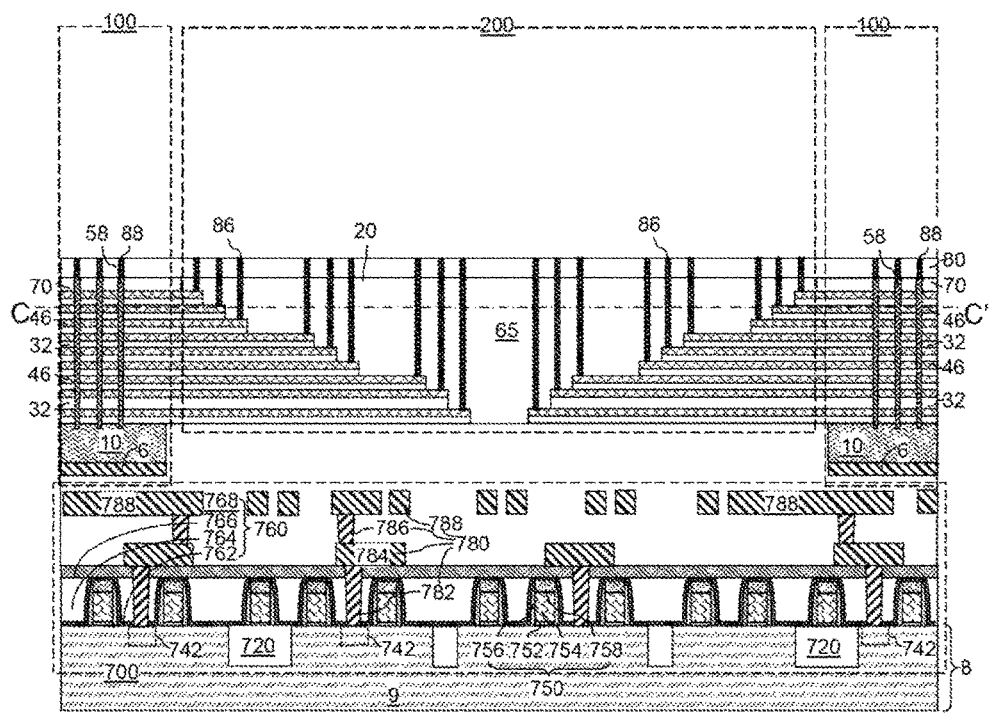
FIG. 12A is a first vertical cross-sectional view of the exemplary structure after formation of word line contact via structures according to an embodiment of the present disclosure.
Figure 12B:
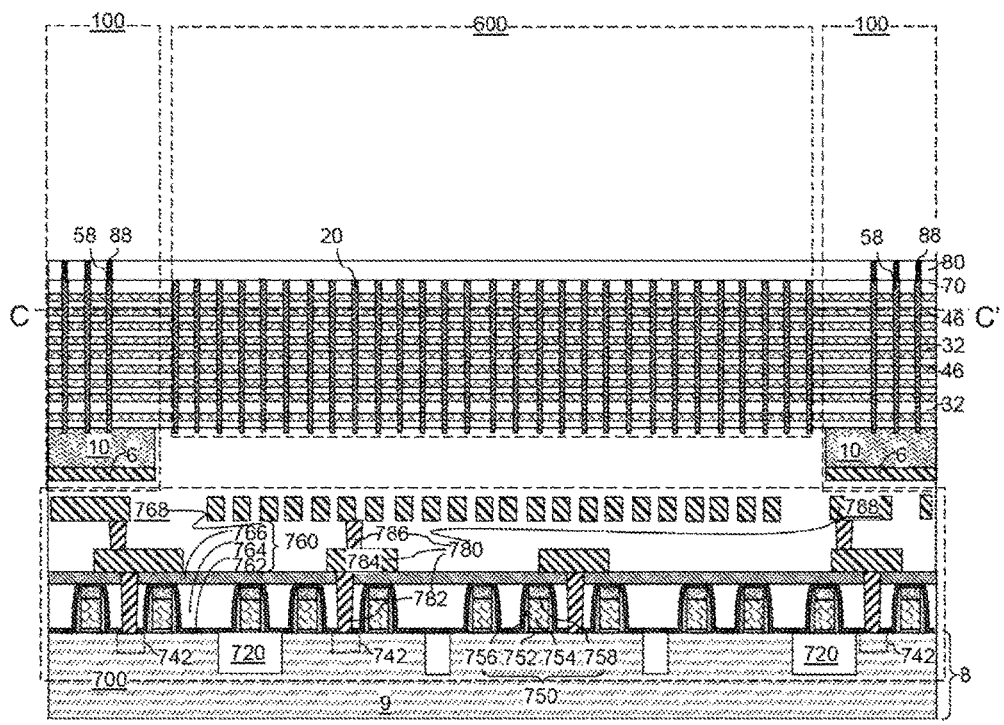
FIG. 12B is a second vertical cross-sectional view of the exemplary structure of FIG. 12A.
Figure 12C:
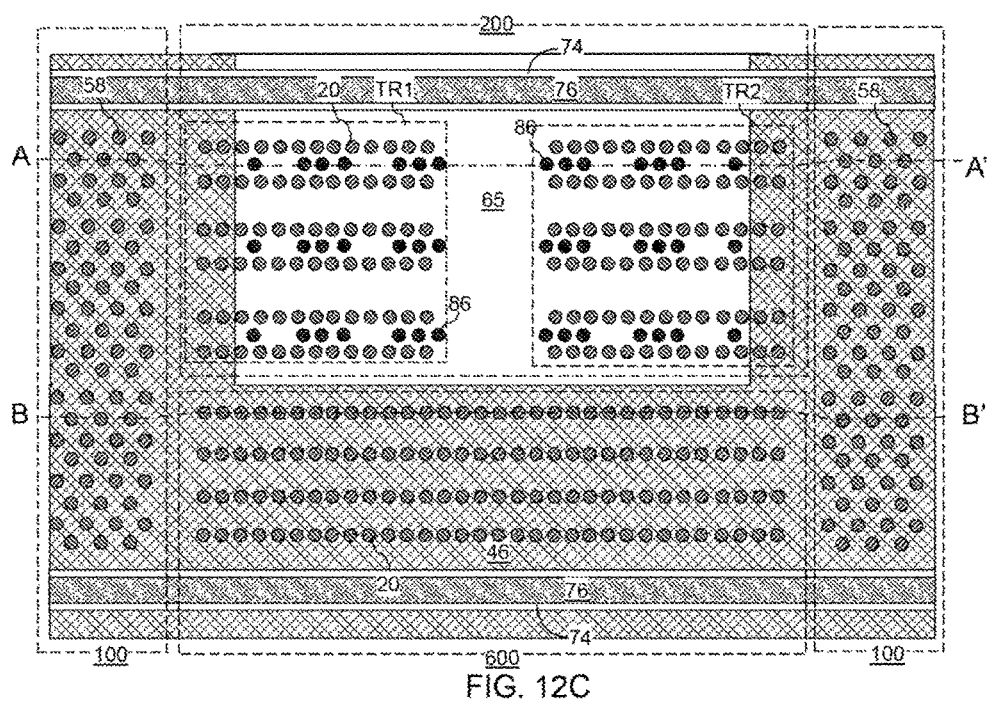
FIG. 12C is a plan view of the exemplary structure of FIGS. 12A and 12B. The vertical plane A-A' corresponds to the plane of the vertical cross-sectional view of FIG. 12A. The vertical plane B-B' corresponds to the plane of the vertical cross-sectional view of FIG. 12B.

Referring to FIGS. 12A-12C, a contact level dielectric layer 80 can be formed over the insulating cap layer 70. Contact via structures can be formed through contact level dielectric layer 80, the insulating cap layer 70, and the retro-stepped dielectric material portions 65 directly on top surfaces of the electrically conductive layers 46 in the word line contact via regions 200. The contact via structures that contact the electrically conductive layers 46 are herein referred to as word line contact via structures 86. Within each word line contact via region 200, the word line contact via structure 86 can be formed on a respective one of the electrically conductive layers 46 in the first terrace region TR1 and in the second terrace region TR2.

In one embodiment, each electrically conductive layer 46 can be contacted by a single word line contact via structure 86 or a set of word line contact via structures 86 provided only in one of the first and second terrace regions (TR1, TR2). In this case, each odd numbered electrically conductive layer 46 (as counted from the bottom) may be contacted in one of the first and second terrace regions (TR1, TR2), and each even numbered electrically conducive layers 46 may be contacted in the other of the first and second terrace regions (TR1, TR2). Alternately, the electrically conductive layers 46 can be divided into two groups, and a first group of electrically conductive layers 46 can be contacted by a first subset of the word line contact via structures 86 provided in the first terrace region TR1, and a second subset of the word line contact via structures 86 can be contacted by a second subset of the word line contact via structures 86 provided in the second terrace region TR2. Alternatively, one or more, or all, of the electrically conductive layers 46 may be contacted in the first terrace region TR1 and in the second terrace region TR2.

Drain contact via structures 88 can be formed through the contact level dielectric layer 80 on each drain region 63 of the memory opening fill structures 58. In one embodiment, conductive structures are not formed through the contact level dielectric layer 80 in regions on the support pillar structures 20. Thus, all top surfaces of the support pillar structures 20 can be contacted by a bottom surface of the contact level dielectric layer 80. Thus, the support pillar structures 20 can remain electrically floating.

Figure 13C:
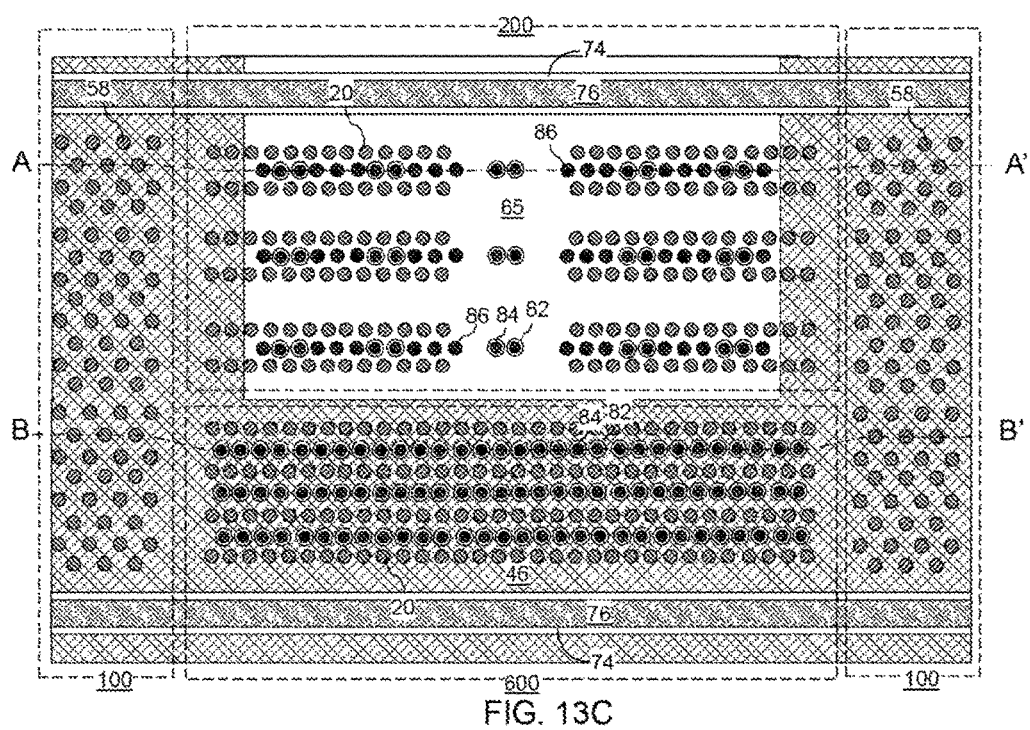
FIG. 13C is a plan view of the exemplary structure of FIGS. 13A and 13B. The vertical plane A-A' corresponds to the plane of the vertical cross-sectional view of FIG. 13A.

Referring to FIGS. 13A-13C, through-memory-level via cavities can be formed in the word line contact via regions 200 and the connection regions 600. Optionally, additional through-memory-level via cavities can be formed in the memory array regions 100. The through-memory-level via cavities extend through the contact level dielectric layer 80, the insulating cap layer 70, and a retro-stepped dielectric material portion 65 and/or the alternating stack (32, 46), and at least partly through the at least one lower level dielectric layer 760 to a top surface of a respective one of the lower level metal interconnect structures 780. The through-memory-level via cavities can be formed by applying and patterning a photoresist layer (not shown) over the contact level dielectric layer 80 to form openings therein, and by transferring the pattern of the openings in the photoresist layer through the contact level dielectric layer 80, the insulating cap layer 70, and a retro-stepped dielectric material portion 65 and/or the alternating stack (32, 46), and at least partly through the at least one lower level dielectric layer 760. The locations of the openings in the photoresist layer can be selected such that the opening overlie components (e.g., metal lines) of the lower level metal interconnect structures 780 and top surfaces of the lower level metal interconnect structures 780 are physically exposed at the bottom of the through-memory-level via cavities. As used herein, a "through-memory-level" element refers to an element that extends through the entire levels of the insulating cap layer 70, the alternating stack (32, 42), and the planar semiconductor material layer 10.

A conformal dielectric material layer is deposited in the through-memory-level via cavities and is anisotropically etched, for example, by a reactive ion etch, to form through-memory-level insulating liners 82. The through-memory-level insulating liners 82 can include a dielectric material such as silicon oxide. The thickness of the through-memory-level insulating liners, as measured between an inner sidewall and an outer sidewall, can be in a range from 5 nm to 100 nm, although lesser and greater thicknesses can also be employed. At least one conductive material can be deposited in the remaining volumes of the through-memory-level via cavities (i.e., inside each through-memory-level insulating liners 82) to form through-memory-level via structures 84.

In each word line contact via region 200, the through-memory-level via structures 84 can be formed through a retro-stepped dielectric material portion 65 and directly on a respective one of the lower metal interconnect structures 780. Additional through-memory-level via structures 84 can be formed through the alternating stack (32, 46) in the connection regions 600. Within each word line contact via region 200, the through-memory-level via structures 84 can extend through a retro-stepped dielectric material portion 65 and extend through less than all layers within the alternating stack (32, 46). Each of the additional through-memory-level via structures 84 extending through the alternating stack (32, 46) in the connection region 600 can extend through each layer within the alternating stack (32, 46). Each of the through-memory-level via structures 84 extending through the retro-stepped dielectric material portion 65 and each of the additional through-memory-level via structures 84 can be laterally isolated from the electrically conductive layers 46 by a respective insulating liner 82, and can contact a respective one of the lower metal interconnect structures 780.

In an alternative embodiment, the through-memory-level via structures 84 can be located in the connection region 600, but not in the word line contact via region 200. In this embodiment, the word line contact via structures 86 can be located in the word line contact via region 200 but not in the connection region 600.

Referring to FIG. 14, at least one upper level dielectric layer 90 and upper metal interconnect structures (96, 98) can be formed over the contact level dielectric layer 80. The at least one upper level dielectric layer 90 can include at least one line level dielectric layer and may optionally include at least one via level dielectric layer. The upper metal interconnect structures (96, 98) can include upper level line structures (i.e., metal lines) and may include upper level via structures. In one embodiment, a subset of the upper metal interconnect structures (96, 98), such as word line interconnection metal lines 96, can be formed over the word line conductive via structures 86, and can provide electrically conductive paths between a respective pair of a through-memory-level via structure 84 and a word line contact via structure 86. The upper metal interconnect structures (96, 98) can include bit lines 98 extending in the bit line direction hd2, which can be connected to bit line sensors (e.g., sense amps) in the sensor array regions 810 through a subset of the through-memory-level via structure 84. In the alternative embodiment in which the word line contact via structures 86 are located only in the word line contact via region 200 and the through-memory-level via structures 84 are located only in the connection region 600, the word line interconnection metal lines 96 can extend in the bit line direction hd2.

The exemplary structure of the present disclosure can include a semiconductor structure. The semiconductor structure can include an alternating stack of insulating layers 32 and electrically conductive layers 46 located over a substrate 8, wherein the insulating layers 32 and the electrically conductive layers 46 within the alternating stack continuously extend into each of: a first memory array region 100A including first memory stack structures 55 that extend through the alternating stack (32, 46); a second memory array region 100B including second memory stack structures 55 that extend through the alternating stack (32, 46), wherein the second memory array region 100B is laterally spaced from the first memory array region 100A along a first horizontal direction hd1; a first terrace region TR1 adjoined to the first memory array region 100A and including first stepped surfaces of the alternating stack (32, 46); a second terrace region TR2 adjoined to the second memory array region 100B and including second stepped surfaces of the alternating stack (32, 46) and spaced from the first terrace region TR1 along the first horizontal direction hd1, wherein the first terrace region TR1 and the second terrace region TR2 are located between the first memory array region 100A and the second array region 100B; and a connection region 600 within which each of the insulating layers 32 and the electrically conductive layers 46 within the alternating stack (32, 46) continuously extends between the first and second memory array regions (100A, 100B).

In one embodiment, a lateral separation distance along the first horizontal direction hd1 between the first stepped surfaces and the second stepped surfaces increases with a vertical distance from the substrate 8 for the electrically conductive layers 46 in the alternating stack (32, 46). In one embodiment, the connection region 600 is laterally spaced from the first and second terrace regions (TR1, TR2) along a second horizontal direction hd2 that is perpendicular to the first horizontal direction hd1. In one embodiment, each layer within the alternating stack (32, 46) has a same width (such as the uniform width W' illustrated in FIG. 9C) along the second horizontal direction hd2 within the connection region 600.

In one embodiment, the connection region 600 is located between the first and the second memory array regions (100A, 100B). The first memory array region 100A, the second memory array region 100B, the connection region 600 and the first and the second terrace regions (TR1, TR2) are located in a same memory plane (P0, P1, P2, or P3). The electrically conductive layers 46 comprise word lines of a NAND memory device which extend in the first horizontal direction hd1 (i.e., word line direction), while bit lines 98 extend in the second horizontal direction hd2 (e.g., bit line direction). Each of the first and the second memory stack structures 55 can comprise a vertical semiconductor channel 60 and a memory film 50.

In one embodiment, the semiconductor structure can include contact via structures, i.e., the word line contact via structures 86, contacting a top surface of a respective one of the electrically conductive layers 46 within the first and second terrace regions (TR1, TR2). A retro-stepped dielectric material portion 65 can be provided, which has a planar top surface and a pair of stepped bottom surfaces. A first stepped bottom surface of the retro-stepped dielectric material portion 65 can contact the first stepped surfaces in the first terrace region TR1, and a second stepped bottom surface of the retro-stepped dielectric material portion 65 can contact the second stepped surfaces in the second terrace region TR2. The contact via structures (i.e., the word line contact via structures 86) can vertically extend through the retro-stepped dielectric material portion 65.

The semiconductor structure can include semiconductor devices 710 located on a substrate semiconductor layer 9 of the substrate 8, lower metal interconnect structures 780 embedded in lower dielectric layers 760 and electrically connected to, and located over, the semiconductor devices 710, and through-memory-level via structures 84 extending through the retro-stepped dielectric material portion 65 and electrically shorted to a respective one of the lower metal interconnect structures 780. Additional through-memory-level via structures 84 can be provided, which extend through the alternating stack (32, 46) in the connection region 600 and are electrically shorted to a respective one of the lower metal interconnect structures 780.

In one embodiment, the through-memory-level via structures 84 extending through the retro-stepped dielectric material portion 65 extend through less than all layers within the alternating stack (32, 46), each of the additional through-memory-level via structures 84 extending through the alternating stack (32, 46) in the connection region 600 extends through each layer within the alternating stack (32, 46), and each of the through-memory-level via structures 84 extending through the retro-stepped dielectric material portion 65 and each of the additional through-memory-level via structures 84 are laterally isolated from the electrically conductive layers 46 by a respective insulating liner, i.e., a through-memory-level insulating liner 82. In one embodiment, a subset of the through-memory-level via structures 84 can be electrically shorted to a respective one of the electrically conductive layers 46 through a respective one of the word line contact via structures 86 and a subset of the upper metal interconnect structures (96, 98), such as word line interconnection metal lines 96.

In one embodiment, a pair of backside trenches 79 can laterally extend along the first horizontal direction hd1 and vertically extend from a bottommost layer of the alternating stack (32, 46) to a topmost layer of the alternating stack (32, 46). A first one 79A of the pair of backside trenches 79 has a sidewall that contacts a first subset of sidewalls of the alternating stack (32, 46) in the first memory array region 100A, in the second memory array region 100B, in the first terrace region TR1, and in the second terrace region TR2, and a second one 79B of the pair of backside trenches 79 has a sidewall that contacts a second subset of sidewalls of the alternating stack (32, 46) in the first memory array region 100A, in the second memory array region 100B, in the connection region 600.

In one embodiment, the semiconductor structure can comprise a monolithic three-dimensional NAND memory device that comprises a first three-dimensional memory array located in the first memory array region 100A and a second three-dimensional memory array located in the second memory array region 100B. The electrically conductive layers 46 comprise, or are electrically connected to, a respective word line of the monolithic three-dimensional NAND memory device. The substrate 8 can comprise a silicon substrate. The first memory stack structures 55 comprise a first array of monolithic three-dimensional NAND strings, and the second memory stack structures 55 comprise a second array of monolithic three-dimensional NAND strings. The silicon substrate contains an integrated circuit (including a subset of the semiconductor devices 710) comprising a driver circuit for the monolithic three-dimensional NAND memory device located thereon. The electrically conductive layers 46 comprise a plurality of control gate electrodes having a strip shape extending substantially parallel to the top surface of the substrate in the first and second memory array regions. Each of the first and second arrays of monolithic three-dimensional NAND strings comprises: a plurality of semiconductor channels (59, 11, 60), wherein at least one end portion 60 of each of the plurality of semiconductor channels (59, 11, 60) extends substantially perpendicular to a top surface of the substrate 8, and a plurality of charge storage elements (embodied as portions of the charge storage layer 54 located at levels of the electrically conductive layers 46), and each charge storage element can be located adjacent to a respective one of the plurality of semiconductor channels (59, 11, 60).

The electrical connection between the electrically conductive layers 46 of the alternating stack (32, 46) and the word line switch devices 710 of the row decoder regions 830 is provided by a set of through-word-line via structures 84 that extend through the retro-stepped dielectric material portions 65 and/or the connection region 600 and the word line interconnection metal lines 96. In this case, the word line switch devices and the set of through-word-line via structures 84 can be provided close to the geometrical center of each plane (P0, P1, P2, P3). The maximum lateral distance for signal propagation within each electrically conductive layer 46 is approximately one half of the width of each plane (P0, P1, P2, P3) along the first horizontal direction hd1. Thus, the maximum lateral distance for signal propagation within each electrically conductive layer 46 of the present disclosure is approximately one half of the maximum lateral distance for signal propagation in conventional configurations in which terrace regions are provided at a periphery of each plane. By providing the word line switch devices and the electrical connection to the word line switch devices at the center of each plane (P0, P1, P2, P3), RC delay of the word lines (i.e., electrically conductive layers 46) can be reduced by approximately 50%. Further, the capacitive coupling between each electrically conductive layer 46 and neighboring electrically conductive elements can be reduced by approximately 50% because the signal propagation distance is effectively halved in the configuration of the present disclosure. Thus, the RC delay for the word lines in the configuration of the present disclosure can be only about 25% of the RC delay in a conventional configuration in which the word line switch devices and the electrical connection to the word line switch devices are provided at the periphery of each plane. The reduction in the RC delay in the configuration of the present disclosure can provide a faster switching speed for the word line signals, and can provide enhanced performance for the memory array operation. Furthermore, in one embodiment, polysilicon can be used to form the select transistors, such as the source and/or drain side select transistors, which reduces device cost and improves device yield.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a semiconductor structure, comprising:
    forming an alternating stack of insulating layers and spacer material layers over a substrate, wherein the spacer material layers are formed as, or are subsequently replaced with, electrically conductive layers;
    covering a connection region with a patterned hard mask layer;
    applying and patterning a trimmable material layer over the alternating stack, wherein the patterned trimmable material layer covers a first memory array region located on one side of the connection region and a second memory array region located on another side of the connection region, and does not cover a center portion of an intermediate region between the first memory array region and the second memory array region, the intermediate region being adjacent to the connection region;
    forming a first terrace region adjoined to the first memory array region at one side of the intermediate region and a second terrace region adjoined to the second memory array region at another side of the intermediate region;
    removing the trimmable material layer and the patterned hard mask layer, wherein each of the insulating layers and the spacer material layers within the alternating stack continuously extends between the first and second memory array regions through the connection region; and
    forming first memory stack structures in the first memory array region and second memory stack structures in the second memory array region.

2. The method of claim 1, wherein the first terrace region and the second terrace region are simultaneously formed by iteratively etching the spacer material layers and the insulating layers of the alternating stack and trimming the trimmable material layer.

3. The method of claim 1, wherein each of the insulating layers and the electrically conductive layers within the alternating stack continuously extends between the first and second memory array regions in the connection region after formation of the electrically conductive layers and after formation of the first and second memory stack structures.

4. The method of claim 1, wherein:
the first memory array region and the second memory array region are laterally spaced from each other along a first horizontal direction;
the connection region is laterally spaced from the first and second terrace regions along a second horizontal direction that is perpendicular to the first horizontal direction; and
each layer within the alternating stack has a same width along the second horizontal direction within the connection region.

5. The method of claim 1, further comprising forming contact via structures on a respective one of the electrically conductive layers in the first terrace region and in the second terrace region.

6. The method of claim 5, further comprising forming a retro-stepped dielectric material portion directly on first stepped surfaces located in the first terrace region and second stepped surfaces located in the second terrace region, wherein the contact via structures are formed through the retro-stepped dielectric material portion.

7. The method of claim 6, further comprising:
forming semiconductor devices over the substrate;
forming a combination of lower metal interconnect structures and lower dielectric layers that embeds the lower metal interconnect structures over the semiconductor devices, wherein the lower metal interconnect structures are electrically connected to the semiconductor devices; and
forming through-memory-level via structures through the retro-stepped dielectric material portion and on a respective one of the lower metal interconnect structures.

8. The method of claim 7, further comprising forming additional through-memory-level via structures through the alternating stack in the connection region, wherein the additional through-memory-level via structures are electrically shorted to a respective one of the lower metal interconnect structures.

9. The method of claim 8, wherein:
the through-memory-level via structures extending through the retro-stepped dielectric material portion extend through less than all layers within the alternating stack;
each of the additional through-memory-level via structures extending through the alternating stack in the connection region extend through each layer within the alternating stack; and
each of the through-memory-level via structures extending through the retro-stepped dielectric material portion and each of the additional through-memory-level via structures are laterally isolated from the electrically conductive layers by a respective insulating liner.

10. The method of claim 8, further comprising forming upper metal interconnect structures, wherein a subset of the upper metal interconnect structures provide electrically conductive paths between a respective pair of a through-memory-level via structure and a contact via structure.

11. The method of claim 1, wherein the spacer material layers are formed as sacrificial material layers, and the method further comprises:
forming first and second backside trenches through the alternating stack, wherein the first backside trench straddles the intermediate region, the first memory array region, and the second memory array region, and the second backside trench straddles the connection region, the first memory array region, and the second memory array region; and
removing the sacrificial material layers by introducing an etchant through the pair of backside contact trenches;
wherein:
the first backside trench has a sidewall that contacts a first subset of sidewalls of the alternating stack in the first memory array region, in the second memory array region, in the first terrace region, and in the second terrace region; and
the second backside trench has a sidewall that contacts a second subset of sidewalls of the alternating stack in the first memory array region, in the second memory array region, in the connection region.

* * * * *